United States Patent
Yang et al.

(10) Patent No.: US 12,532,666 B2
(45) Date of Patent: Jan. 20, 2026

(54) METHOD FOR MANUFACTURING A MEMORY DEVICE USING MULTIPLE ETCHING PROCESSES

(71) Applicant: Taiwan Semiconductor Manufacturing Company, Ltd., Hsinchu (TW)

(72) Inventors: Chang-Lin Yang, Taoyuan (TW); Sheng-Yuan Chang, Hsinchu (TW); Chung-Te Lin, Tainan (TW); Han-Ting Lin, Hsinchu (TW); Chien-Hua Huang, Toufen Township, Miaoli County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 810 days.

(21) Appl. No.: 17/672,073

(22) Filed: Feb. 15, 2022

(65) Prior Publication Data
US 2023/0263069 A1    Aug. 17, 2023

(51) Int. Cl.
*H10N 50/10* (2023.01)
*H10B 61/00* (2023.01)
*H10N 50/01* (2023.01)
*H10N 50/80* (2023.01)
*H10N 50/85* (2023.01)

(52) U.S. Cl.
CPC .............. *H10N 50/10* (2023.02); *H10B 61/22* (2023.02); *H10N 50/01* (2023.02); *H10N 50/80* (2023.02); *H10N 50/85* (2023.02)

(58) Field of Classification Search
CPC ........ H10N 50/10; H10N 50/80; H10N 50/01; H10N 50/85; H10B 61/22
USPC ......................................................... 257/421
See application file for complete search history.

(56) References Cited

U.S. PATENT DOCUMENTS

| | | | |
|---|---|---|---|
| 11,094,878 B2 * | 8/2021 | Annunziata ............ | H01F 41/34 |
| 11,329,100 B2 * | 5/2022 | Pinarbasi ............... | H10N 50/01 |
| 2012/0052258 A1 * | 3/2012 | Op De Beeck ........ | H10N 50/01 |
| | | | 216/13 |
| 2017/0125480 A1 * | 5/2017 | Annunziata ............ | H10N 50/85 |
| 2017/0263861 A1 * | 9/2017 | Park ....................... | H10N 50/01 |
| 2018/0375018 A1 * | 12/2018 | Deshpande ............ | H10N 50/10 |
| 2019/0173004 A1 * | 6/2019 | Deshpande ............ | H10N 50/85 |
| 2020/0313077 A1 * | 10/2020 | Ha .......................... | H10B 12/48 |
| 2020/0350495 A1 * | 11/2020 | Dutta ..................... | H10N 50/80 |
| 2023/0217835 A1 * | 7/2023 | Eom ...................... | H01J 37/305 |
| | | | 438/3 |

\* cited by examiner

*Primary Examiner* — Jami Valentine Miller
(74) *Attorney, Agent, or Firm* — McClure, Qualey & Rodack, LLP

(57) ABSTRACT

A method for manufacturing a memory device includes forming a first metal layer over a substrate, forming a magnetic tunnel junction (MTJ) layer stack over the first metal layer, forming a second metal layer over the MTJ layer stack, forming a hard mask layer over the second metal layer, performing a first etching process on the MTJ layer stack to form an MTJ structure and a redeposited layer on a sidewall of the MTJ structure, performing a second etching process to remove the redeposited layer, and performing a third etching process on the sidewall of the MTJ structure.

20 Claims, 20 Drawing Sheets

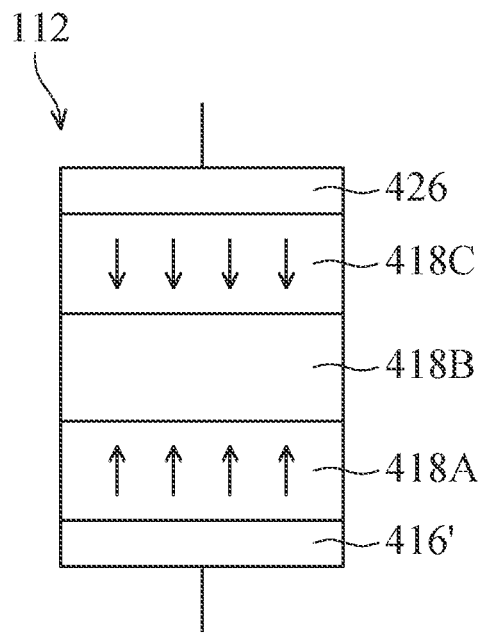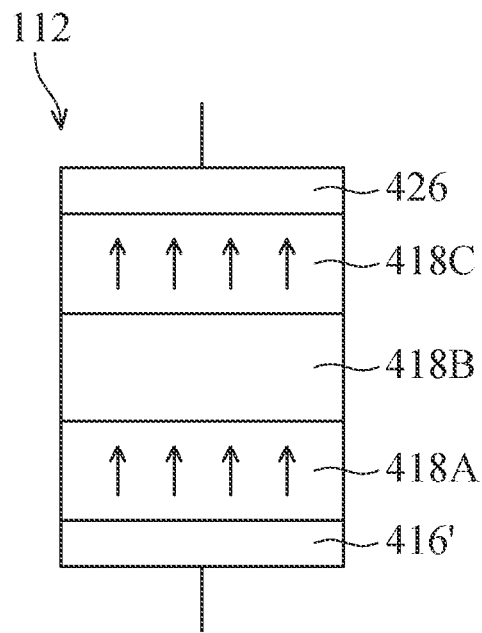
FIG. 2A　　　　　　　　FIG. 2B
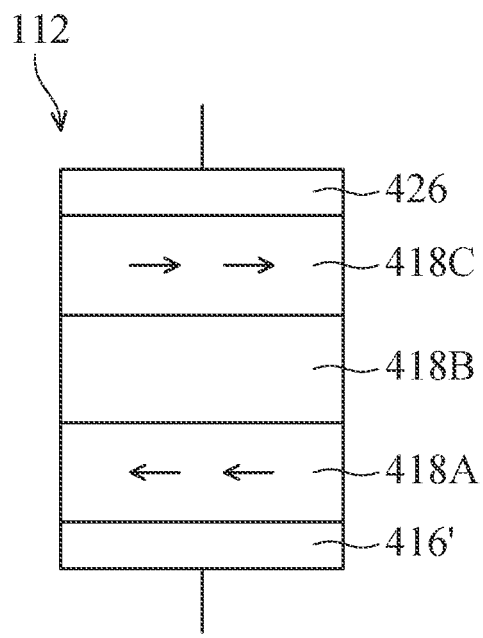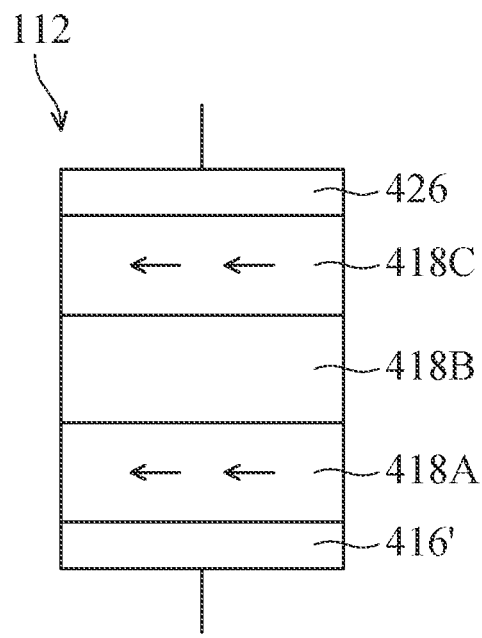
FIG. 2C　　　　　　　　FIG. 2D

METHOD FOR MANUFACTURING A MEMORY DEVICE USING MULTIPLE ETCHING PROCESSES

BACKGROUND

Many modern day electronic devices contain electronic memory. The electronic memory includes hard disk drives and random access memories (RAMs). A random access memory may be a volatile memory where the stored data is lost in the absence of power or a non-volatile memory which stores data in the absence of power. Dynamic random access memory (DRAM) and static random access memory (SRAM) are two typical kinds of volatile memory. Flash memory was widely used as non-volatile memory. Resistive or magnetic memory devices including tunnel junctions (MTJs) can be used in hard disk drives and/or RAM, and are promising candidates for next generation memory solutions due to relative simple structures and their compatibility with complementary metal-oxide-semiconductor (CMOS) logic fabrication processes.

A magnetic random access memory (MRAM) is a device based on a magnetic tunnel junction cell formed with a semiconductor device, and offers comparable performance to SRAM and comparable density with lower power consumption to DRAM. Compared to non-volatile memory (NVM) flash memory, a MRAM offers much faster access times and suffers minimal degradation over time, whereas a flash memory can only be rewritten a limited number of times. An MRAM cell is formed by a magnetic tunneling junction (MTJ) comprising two ferromagnetic layers which are separated by a thin insulating barrier, and operates by tunneling of electrons between the two ferromagnetic layers through the insulating barrier.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A, 2B, 2C, and 2D illustrate memory operations of embodiments of the MTJ cell of the present disclosure, in accordance with some embodiments.

DETAILED DESCRIPTION

Figure 1:
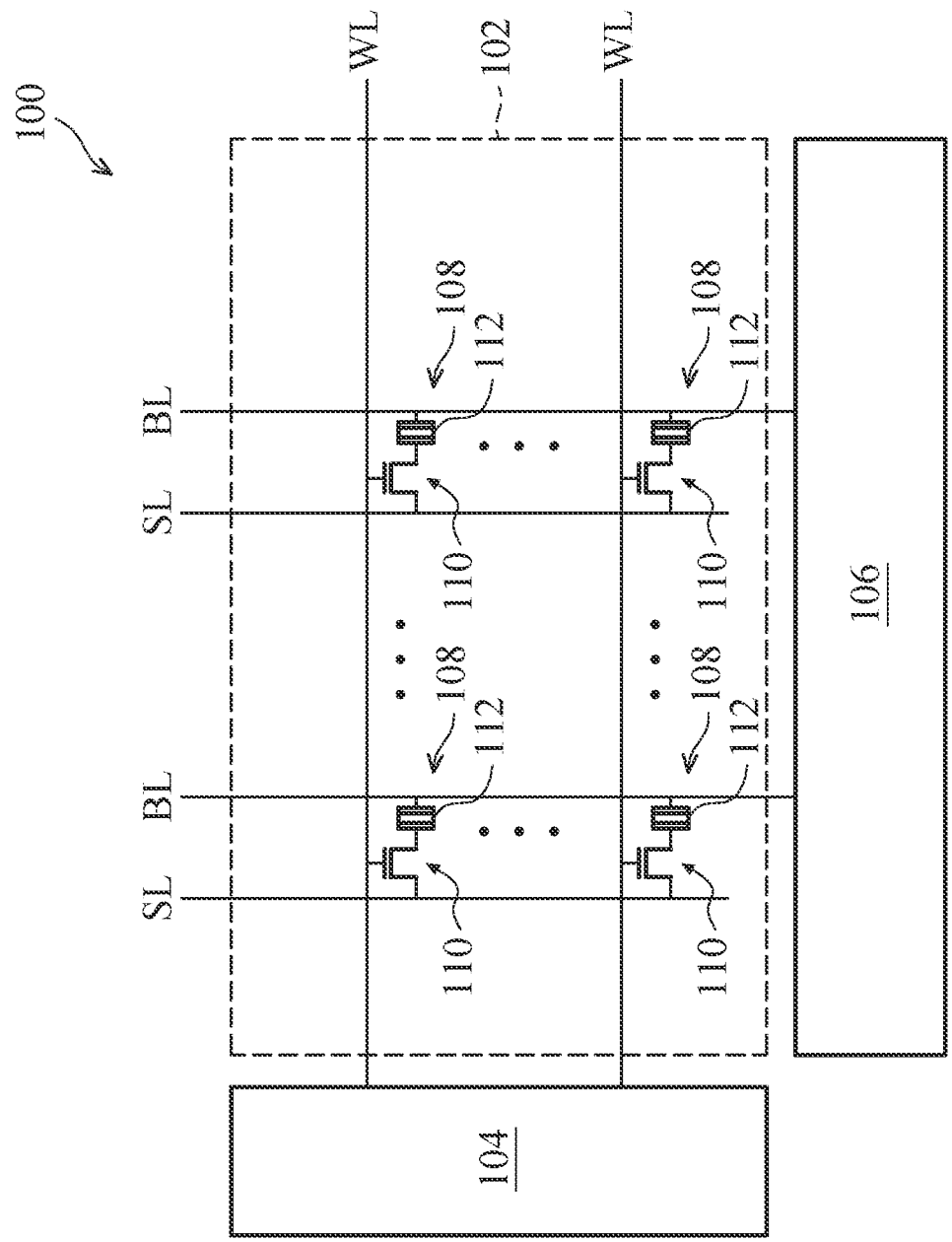
FIG. 1 illustrates a block diagram of an embodiment of a memory device of the present disclosure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure offer advantages over the existing art, though it is understood that other embodiments may offer different advantages, not all advantages are necessarily discussed herein, and no particular advantage is required for all embodiments. For example, embodiments discussed herein include structures and methods including an etch process for trimming a magnetic tunneling junction (MTJ) structure of a magnetic random access memory (MRAM). The details of the structure and fabrication methods of the present disclosure are described below in conjunction with the accompanying drawings, which illustrate the process of making MRAM devices, according to some embodiments.

FIG. 1 illustrates a block diagram of an embodiment of a memory device 100 of the present disclosure, in accordance with some embodiments. The memory device 100 includes an MRAM array 102, a row decoder 104, and a column decoder 106. The MRAM array 102 includes MRAM devices 108 (may also referred to as MRAM cells) arranged in rows and columns. The row decoder 104 may be, e.g., a static CMOS decoder, a pseudo-NMOS decoder, or the like. During operation, the row decoder 104 selects desired MRAM devices 108 in a row of the MRAM array 102 by activating the respective word line WL for the row. The column decoder 56 may be, e.g., a static CMOS decoder, a pseudo-NMOS decoder, or the like, and may include writer drivers, sense amplifiers, a combination thereof, or the like. During operation, the column decoder 106 selects bit lines BL for the desired MRAM devices 108 from columns of the MRAM array 102 in the selected row, and reads data from or writes data to the selected MRAM devices 108 with the bit lines BL.

In some embodiments, as shown in FIG. 1, each MRAM device 108 has one transistor 110 and one MTJ cell 112.

Therefore, this type of MRAM architecture is called 1T1R. In other embodiments, two transistors are assigned to one MTJ cell, forming a 2T1R system. Other cell array configurations can be employed. The transistor 110 may be a metal-oxide-semiconductor field-effect transistor (MOSFET) including, but not limited to, a planar MOSFET, a finFET, a gate-all-around (GAA) FET, or any other active devices. A control terminal (e.g., a gate terminal) of the transistor 110 is coupled to the word line WL. A drain terminal of the transistor 110 is coupled to the MTJ cell 112. A source terminal of the transistor 110 is coupled to the source line SL having a fixed potential (e.g., the ground).

Resistance state of the MTJ cell 112 determines the binary logic data ("0" and "1") of the MRAM device 108. FIGS. 2A to 2D illustrate memory operations of embodiments of the MTJ cell 112 of the present disclosure, in accordance with some embodiments. As shown in FIGS. 2A to 2D, the MTJ cell 112 includes a bottom electrode 416', a reference layer 418A, a tunnel barrier layer 418B, a free layer 418C, and a top electrode 426. In FIGS. 3A to 3D, the other layers or features are omitted, such as cap layer. In some embodiments, the reference layer 418A, the tunnel barrier layer 418B, the free layer 418C, and the cap layer (if present) may be collectively referred to as MTJ structure.

The reference layer 418A has a fixed magnetization direction and the free layer 418C has a variable magnetization direction. In some embodiments, the spin directions of the reference layer 418A and the free layer 418C are parallel to the film stack direction (perpendicular to the surface of the films) of the MTJ cell 112, as shown in FIGS. 2A and 2B. In FIG. 2A, the reference layer 418A and the free layer 418C are magnetically oriented in opposite directions, as arrows shown. In FIG. 2B, the reference layer 418A and the free layer 418C are magnetically oriented in the same direction, as arrows shown. In other embodiments, the spin directions of the reference layer 418A and the free layer 418C are perpendicular to the film stack direction (parallel with the surface of the films) of the MTJ cell 112, as shown in FIGS. 2C and 2D. In FIG. 2C, the reference layer 418A and the free layer 418C are magnetically oriented in opposite directions, while in FIG. 2D, the reference layer 418A and the free layer 418C are magnetically oriented in the same direction. In some embodiments, the reference layer and the free layer may be respectively referred to as pinned magnetic layer and free magnetic layer.

Since the reference layer 418A and the free layer 418C are magnetically oriented in opposite directions in FIGS. 2A and 2C, the MTJ cell 112 is in AP (anti-parallel) state with a higher resistance. When reading such an MRAM device 108 with a higher resistance MTJ cell 112, a lower current is obtained. Therefore, in this case, binary logic data "0" is stored in the MRAM device 108. Since the reference layer 418A and the free layer 418C are magnetically oriented in the same direction in FIGS. 2B and 2D, the MTJ cell 112 is in P (parallel) state with a lower resistance. When reading the MRAM device 108 with such lower resistance MTJ cell 112, a higher current is obtained. Therefore, in this case, binary logic data "1" is stored in the MRAM device 108. Further, since the stored data does not require a storage energy source, the cell is non-volatile.

Figure 3:
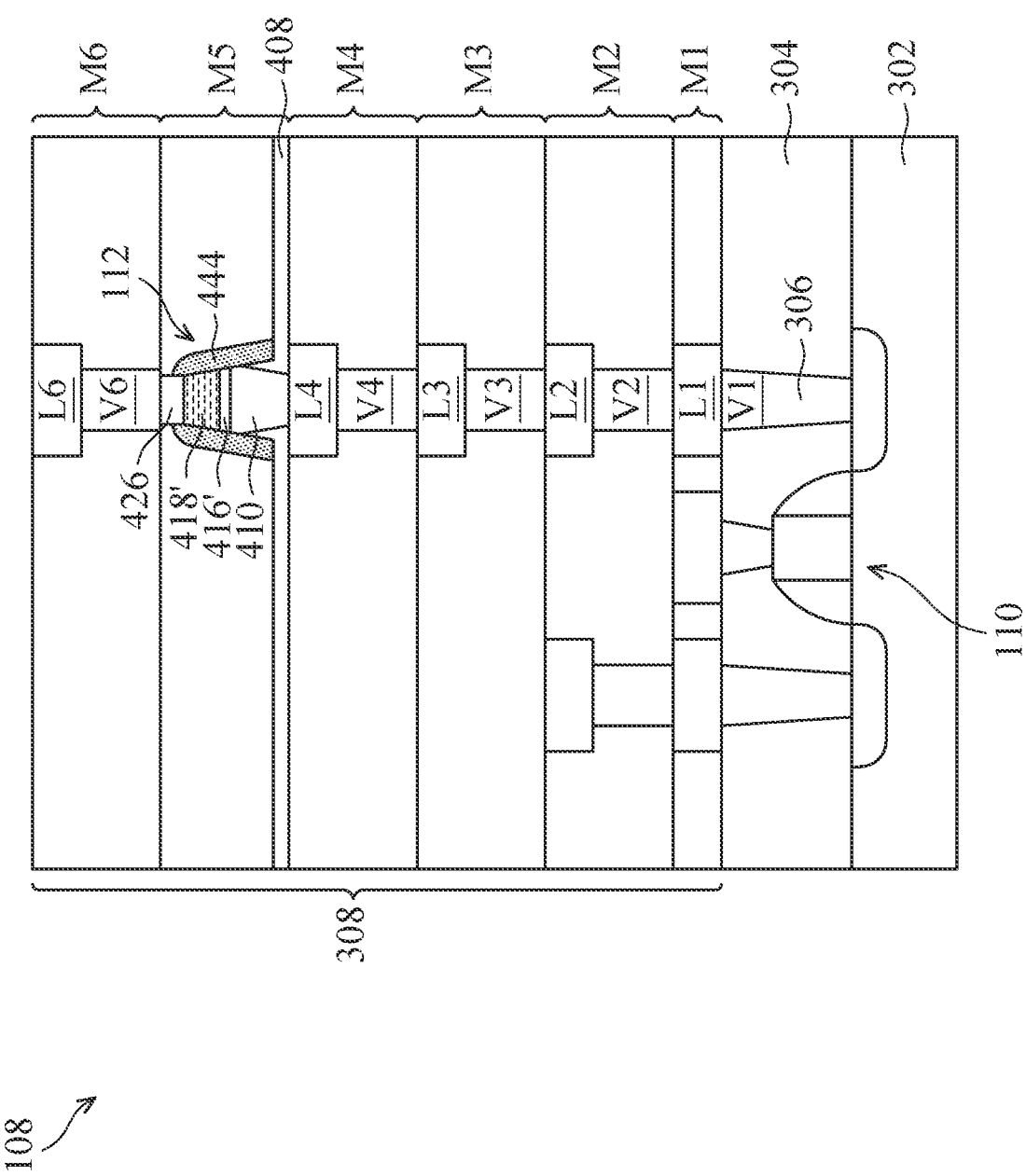
FIG. 3 illustrates a cross-sectional view of an embodiment of the MRAM device of the present disclosure, in accordance with some embodiments.

FIG. 3 illustrates a cross-sectional view of an embodiment of the MRAM device 108 of the present disclosure, in accordance with some embodiments. FIG. 3 is a simplified view, and some features of the MRAM device 108 (discussed below) are omitted for clarity of illustration. The MRAM device 108 is formed over a substrate 302. In some embodiments, the substrate 302 contains a semiconductor material, such as bulk silicon (Si). In some other embodiments, the substrate 302 may include other semiconductors such as germanium (Ge), silicon germanium (SiGe), silicon carbide (SiC), or a III-V semiconductor material. Example III-V semiconductor materials may include gallium arsenide (GaAs), indium phosphide (InP), gallium phosphide (GaP), gallium nitride (GaN), gallium arsenide phosphide (GaAsP), aluminum indium arsenide (AlInAs), aluminum gallium arsenide (AlGaAs), gallium indium phosphide (GaInP), and indium gallium arsenide (InGaAs). The substrate 302 may also include an insulating layer, such as a silicon oxide layer, to have a silicon-on-insulator (SOI) structure or a germanium-on-insulator (GOI) structure. In some embodiments, the substrate 302 may include one or more well regions, such as n-type well regions doped with an n-type dopant (i.e., phosphorus (P) or arsenic (As)) or p-type well regions doped with a p-type dopant (i.e., boron (B)), for forming different types of devices.

A transistor 110 is formed at the active surface of the substrate 302. The transistor 110 may be an access transistor for the MRAM device 108. The transistor 110 may be a planar MOSFET, a finFET, a gate-all-around (GAA) FET, or any other transistors for the access transistor of the MRAM device 108. One or more inter-layer dielectric (ILD) layer(s) 304 are formed over the substrate 302, and electrically conductive features, such as a contact plug 306, are formed physically and electrically coupled to the transistor 110. The ILD layer(s) 304 may be formed of any suitable dielectric material, for example, an oxide such as silicon oxide, phosphosilicate glass (PSG), borosilicate glass (BSG), boron-doped phosphosilicate glass (BPSG), or the like; a nitride such as silicon nitride; or the like. The ILD layer(s) may be formed by any suitable deposition process, such as spin coating, physical vapor deposition (PVD), chemical vapor deposition (CVD), a combination thereof, or the like. The electrically conductive features in the ILD layer(s) may be formed through any suitable process, such as deposition, damascene (e.g., single damascene, dual damascene, etc.), the like, or a combination thereof.

An interconnect structure 308 is formed over the substrate 302, e.g., over the ILD layer(s) 304. The interconnect structure 308 includes multiple metallization layers M1 to M6. Although six metallization layers are illustrated, it should be appreciated that more or less metallization layers may be included. Each of the metallization layers M1 to M6 includes metallization patterns in dielectric layers. The metallization patterns are electrically coupled to the transistor 110 in the substrate 302, and include, respectively, metal lines L1 to L6 and vias V1 to V6 formed in one or more inter-metal dielectric (IMD) layers. The interconnect structure 308 may formed by a damascene process, such as a single damascene process, a dual damascene process, or the like. In some embodiments, the contact plug 306 is also part of the metallization patterns, such as part of the lowest layer of the via V1.

The MTJ cells 112 of the MRAM devices 108 (see FIG. 1) are formed in the interconnect structure 308. The MTJ cells 112 may be formed in any of the metallization layers M1 to M6, and be illustrated as being formed in the metallization layer M5 in the FIG. 3. Each of the MTJ cells 112 is formed over a via 410 and includes a bottom electrode 416' over the via 410, an MTJ structure 418' over the bottom electrode 416', and a top electrode 426 over the MTJ structure 418'. Another IMD layer 408 can be formed around the MTJ cell 112, with the via 410 extending through the IMD layer 408. Spacers 444 may also be formed around the MTJ cell 112s. The IMD layer 408 and/or spacers 444 surround and protect the components of the MTJ cell 112s. As discussed above, the MTJ cell 112 may be changed between the higher resistance (RAP), which can signify a code such as a "0," and the lower resistance (Rp), which can signify a code such as a "1," such that the resistance of the MTJ cell 112 is programmable. As such, a code can be written to the MRAM device 108 by programming the resistance of its MTJ cell 112 with its corresponding access transistor, and a code may be read by measuring the resistance of its MTJ cell 112 with its corresponding access transistor.

As shown in FIG. 3, the MTJ cell 112 is electrically coupled to the transistor 110. The via 410 is physically and electrically coupled to an underlying metallization pattern, such as to the metal line L4 in the illustrated example. The top electrode 426 is physically and electrically coupled to an overlying metallization pattern, such as to the via V6 in the illustrated example. The MTJ cells 112 are arranged in the MRAM array 102 having rows and columns of memory, as shown in FIG. 1. The metallization patterns include access lines (e.g., the word lines WL and the bit lines BL) for the MRAM array 102. For example, the underlying metallization patterns (e.g., the metallization layer M1 to M4) may include the word lines WL disposed along the rows of the MRAM array 102 and the overlying metallization patterns (e.g., the metallization layer M6) may include bit lines BL disposed along the columns of the MRAM array 102.

FIGS. 4A to 4M illustrate various cross-sectional views of intermediate stages in the manufacturing of the MRAM devices 108 in the memory device 100, in accordance with some embodiments. Specifically, the manufacturing of the interconnect structure 308 in FIG. 2 for the memory device 100 is shown. As noted above, the interconnect structure 308 includes the MTJ cells 112 of the MRAM devices 108, as shown in FIGS. 1 and 2.

Figure 4A:
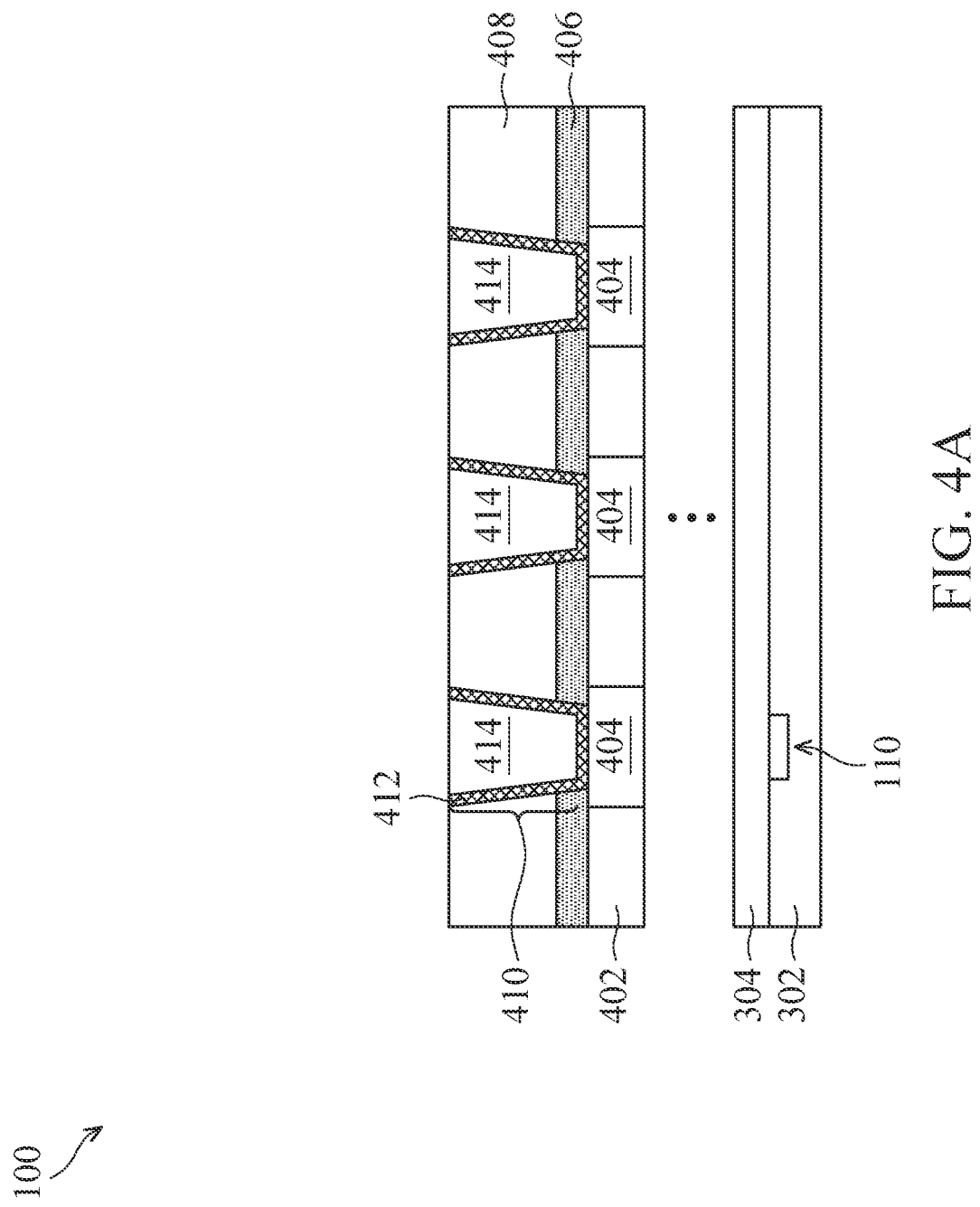
FIGS. 4A, 4B, 4C, 4D, 4E, 4F, 4G, 4H, 4I, 4J, 4K, 4L, and 4M illustrate various cross-sectional views of intermediate stages in the manufacturing of the MRAM devices in the memory device, in accordance with some embodiments.

Referring to FIG. 4A, a metallization layer (e.g., the metallization layer M4 shown in FIG. 2) of the interconnect structure is formed over the substrate 302. The metallization layer comprises an IMD layer 402 and conductive features 404 (which may correspond to the metal lines L4 shown in FIG. 2). The IMD layer 102 is formed over the ILD layer(s) 304. The IMD layer 402 may be formed of any suitable dielectric material, for example, a nitride such as silicon nitride; an oxide such as silicon oxide, phosphosilicate glass (PSG), borosilicate glass (BSG), boron-doped phosphosilicate glass (BPSG), or the like; or the like. The IMD layer 402 may be formed by any acceptable deposition process, such as spin coating, physical vapor deposition (PVD), chemical vapor deposition (CVD), the like, or a combination thereof. The IMD layer 402 may be a layer formed of a low-k dielectric material having a k-value lower than about 3.0. The IMD layer 402 may be a layer formed of an extra-low-k (ELK) dielectric material having a k-value of less than 2.5. It should be noted that the transistors 110 are simplified (represented by a box) and the features (e.g., contact plug 306) in the 304 are omitted in FIGS. 4A to 4M.

Conductive features 404 are formed in the IMD layer 402, and are electrically connected to the transistors 110. In some embodiments, the conductive features 404 include diffusion barrier layers and conductive material over the diffusion barrier layers. Openings are formed in the IMD layer 402 using, e.g., an etching process. The openings expose underlying conductive features, such as underlying vias (e.g., vias V4 shown in FIG. 3). The diffusion barrier layers may be formed of TaN, Ta, TiN, Ti, CoW, or the like, and may be formed in the openings by a deposition process such as atomic layer deposition (ALD) or the like. The conductive material may include copper, aluminum, tungsten, silver, and a combination thereof, or the like, and may be formed over the diffusion barrier layers in the openings by an electro-chemical plating process, CVD, ALD, PVD, the like, or a combination thereof. In some embodiments, the conductive material is copper, and the diffusion barrier layers are thin barrier layers that prevent the copper from diffusing into the IMD layer 402. After formation of the diffusion barrier layers and the conductive material, excess of the diffusion barrier layers and conductive material may be removed by, for example, a planarization process such as a chemical mechanical polish (CMP) process. In some embodiments, the conductive features 404 may be also referred to as metal lines.

An etch stop layer 406 is formed over the conductive features 404 and IMD layer 402. The etch stop layer 406 be formed of a dielectric material such as aluminum nitride, aluminum oxide, silicon oxide, silicon nitride, silicon oxynitride, silicon carbide, a combination thereof, or the like. The etch stop layer 406 may be formed by chemical vapor deposition (CVD), PVD, ALD, a spin-on-dielectric process, the like, or a combination thereof. The etch stop layer 406 may also be a composite layer formed of a plurality of different dielectric sublayers. For example, the etch stop layer 406 may include a silicon carbide sublayer and an aluminum oxide sublayer formed on the silicon carbide sublayer. The silicon carbide sublayer may be used as a glue layer to improve adhesion between the aluminum oxide sublayer and the IMD layer 402.

An IMD layer 408 is formed over the etch stop layer 406. In some embodiments, the IMD layer 408 is formed of a tetraethyl orthosilicate (TEOS) oxide (e.g., silicon oxide deposited using, e.g., a chemical vapor deposition (CVD) process with TEOS as a precursor). In some embodiments, the IMD layer 408 may be formed using PSG, BSG, BPSG, undoped silicate glass (USG), fluorosilicate glass (FSG), SiOCH, flowable oxide, a porous oxide, or the like, or a combination thereof. The IMD layer 408 may also be formed of a low-k dielectric material with a k-value lower than about 3.0.

vias 410 are formed extending through the IMD layer 408 and the etch stop layer 406, such that the vias 410 are electrically connected to (or in contact with) the conductive features 404. The vias 410 can also be referred to as bottom vias. In some embodiments, the vias 410 may each include a conductive material 414 and a conductive barrier layer 412 lining sidewalls and bottom surfaces of the conductive material 414. The conductive barrier layer 412 may be formed of titanium, titanium nitride, tantalum, tantalum nitride, cobalt, a combination thereof, or the like. The conductive material 414 may be copper, aluminum, tungsten, cobalt, alloys thereof, or the like. The formation of the vias 410 may include etching the IMD layer 408 and the etch stop layer 406 to form via openings, conformally forming a conductive barrier layer extending into the via openings, depositing a metallic material over the conductive barrier layer, and performing a planarization process, such as a CMP process or a mechanical grinding process, to remove excess portions of the conductive barrier layer and the metallic material.

Figure 4B:
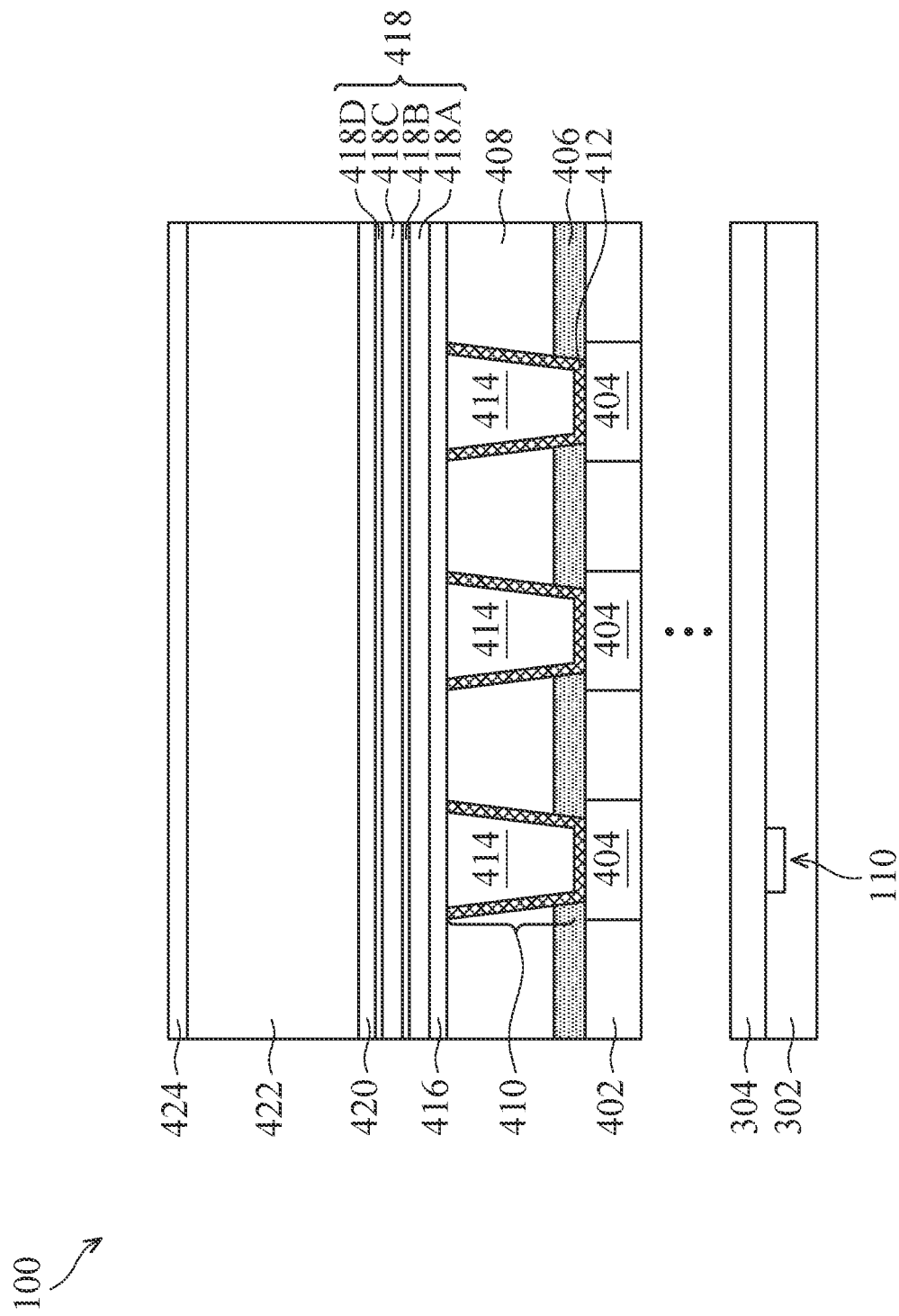

Referring to FIG. 4B, a metal layer 416 is formed over the substrate 302. More specifically, the metal layer 416 is formed over the vias 410 and the IMD layer 408. The metal layer 416 is formed of a conductive material such as copper (Cu), titanium (Ti), tantalum (Ta), aluminum (Al), tungsten (W), platinum (Pt), nickel (Ni), chromium (Cr), ruthenium (Ru), titanium nitride (TiN), tantalum nitride (TaN), a combination thereof, multilayers thereof, or the like. The metal layer 416 is conformally formed, and may be formed using CVD, PVD, ALD, electro-chemical plating, electroless plating, or the like. In sequent processes, the metal layer 416 is patterned into bottom electrodes, so that the metal layer 416 may also be referred to as bottom electrode layer.

Still referring to FIG. 4B, an MTJ layer stack 418 is formed over the metal layer 416. The MTJ film stack 418 is a multilayer that includes a reference layer 418A over the metal layer 416, a tunnel barrier layer 418B over the reference layer 418A, a free layer 418C over the tunnel barrier layer 418B, and a cap layer 418D over the free layer 418C. Each layer of the MTJ layer stack 418 may be deposited using one or more deposition methods such as, CVD, PVD, ALD, a combination thereof, or the like.

The reference layer 418A may be formed of a ferromagnetic material with a greater coercivity field than the free layer 418C, such as cobalt iron (CoFe), cobalt iron boron (CoFeB), a combination thereof, or the like. In some embodiments, the reference layer 418A may be formed of a plurality of different ferromagnetic and nonmagnetic sublayers, which may be referred to as referred to as flux-closure layer(s). In some embodiments, the flux-closure layer(s) include hard-biasing layers, an antiparallel-coupling layer, and reference layers. During operation, antiparallel coupling occurs across the antiparallel-coupling layer, thereby orienting the magnetizations of the hard-biasing layers and the reference layers in antiparallel directions and forming a flux closure with a small net magnetization. Stray fields emitting from the flux closure into the free layer 418C thus become sufficiently negligible that the magnetization of the free layer 418C can freely switch.

The tunnel barrier layer 418B includes a relatively thin dielectric layer capable of electrically isolating the free layer 418C from the reference layer 418A at low potentials and capable of conducting current through electron tunneling at higher potentials. In some embodiments, the tunnel barrier layer 418B may be formed of a dielectric material, such as magnesium oxide (MgO), aluminum nitride (AlN), aluminum oxide (AlO), a combination thereof, or the like. In some embodiments, a thickness of the tunnel barrier layer 418B may be greater than a thickness of the reference layer 418A.

The free layer 418C may be formed of a suitable ferromagnetic material such as CoFe, NiFe, CoFeB, CoFeBW, a combination thereof, or the like. As discussed above, the magnetization direction of the free layer 418C is variable (programmable), and the resistances of the resulting MTJ cell is accordingly programmable. In some embodiments, a thickness of the free layer 418C may be greater the thickness of the tunnel barrier layer 418B. In other embodiments, the thickness of the free layer 418C may be smaller than the thickness of the reference layer 418A.

The capping layer 418D formed over the free layer 166 may enhance anisotropy of the free layer 418C. In some embodiments, the cap layer 418D is formed of a dielectric material, such as magnesium oxide (MgO), aluminum nitride (AlN), aluminum oxide (AlO), a combination thereof, multilayers thereof, or the like. In other embodiments, a material of the capping layer 418D may be the same as a material of tunnel barrier layer 418B, such as magnesium oxide (MgO).

Still referring to FIG. 4B, a metal layer 420 is formed over the MTJ layer stack 418. In some embodiments, the metal layer 420 is formed as a blanket layer. The metal layer 420 is formed of a conductive material such as copper (Cu), titanium (Ti), tantalum (Ta), aluminum (Al), tungsten (W), platinum (Pt), nickel (Ni), chromium (Cr), ruthenium (Ru), titanium nitride (TiN), tantalum nitride (TaN), a combination thereof, multilayers thereof, or the like. The metal layer 420 is conformally formed, and may be formed using CVD, PVD, ALD, electro-chemical plating, electroless plating, or the like. In some embodiments, the metal layer 420 is used as a hard mask in the subsequent patterning of the MTJ layer stack 418.

a metal layer 422 is formed over the metal layer 420. I In some embodiments, the metal layer 422 is formed as a blanket layer. The metal layer 422 is formed of a conductive material such as copper (Cu), titanium (Ti), tantalum (Ta), aluminum (Al), tungsten (W), platinum (Pt), nickel (Ni), chromium (Cr), ruthenium (Ru), titanium nitride (TiN), tantalum nitride (TaN), a combination thereof, multilayers thereof, or the like. The metal layer 422 is conformally formed, and may be formed using CVD, PVD, ALD, electro-chemical plating, electroless plating, or the like. In some embodiments, the metal layer 422 is formed using similar materials and methods as the metal layer 420. For example, the metal layer 420 and metal layer 422 may both be titanium nitride (TiN). In other embodiments, the metal layer 420 and metal layer 422 may be different materials. The thickness of the metal layer 422 may be greater than the thickness of the metal layer 420. The metal layer 422 is used as a hard mask in the subsequent patterning of the MTJ layer stack 418. In sequent processes, the metal layer 420 and the metal layer 422 are patterned into top electrodes, so that the metal layer 420 and the metal layer 422 may also be referred to as top electrode layers.

After forming the metal layer 422, one or more masks may be formed over the metal layer 422. In some embodiments, the one or more masks may include one or more hard masks, a tri-layer mask, a combination thereof, or the like. For example, a hard mask layer 424 may be formed over the metal layer 422. In some embodiments, the hard mask layer 424 is formed of an oxide such as titanium oxide, silicon oxide, a combination thereof, or the like.

Figure 4C:
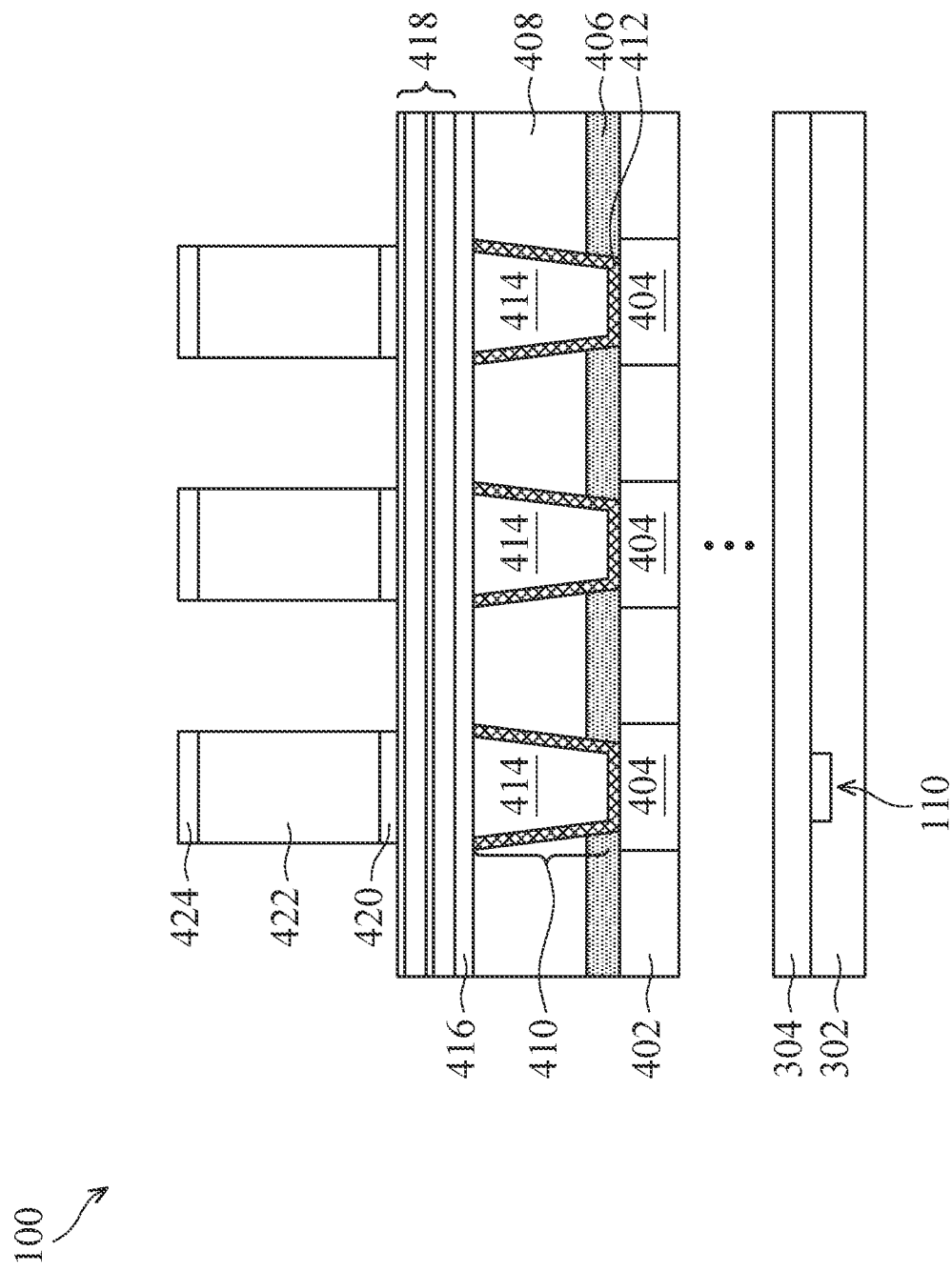

Referring to FIG. 4C, the metal layer 420, the metal layer 422, the hard mask layer 424 are patterned by performing an etching process. The etching process may include a plasma etching process, such as ion beam etching (IBE) process. The etching process may be implemented using glow discharge plasma (GDP), capacitive coupled plasma (CCP), inductively coupled plasma (ICP), or the like. After the etching process, portions of the MTJ layer stack 418 may be exposed.

Figure 4D:
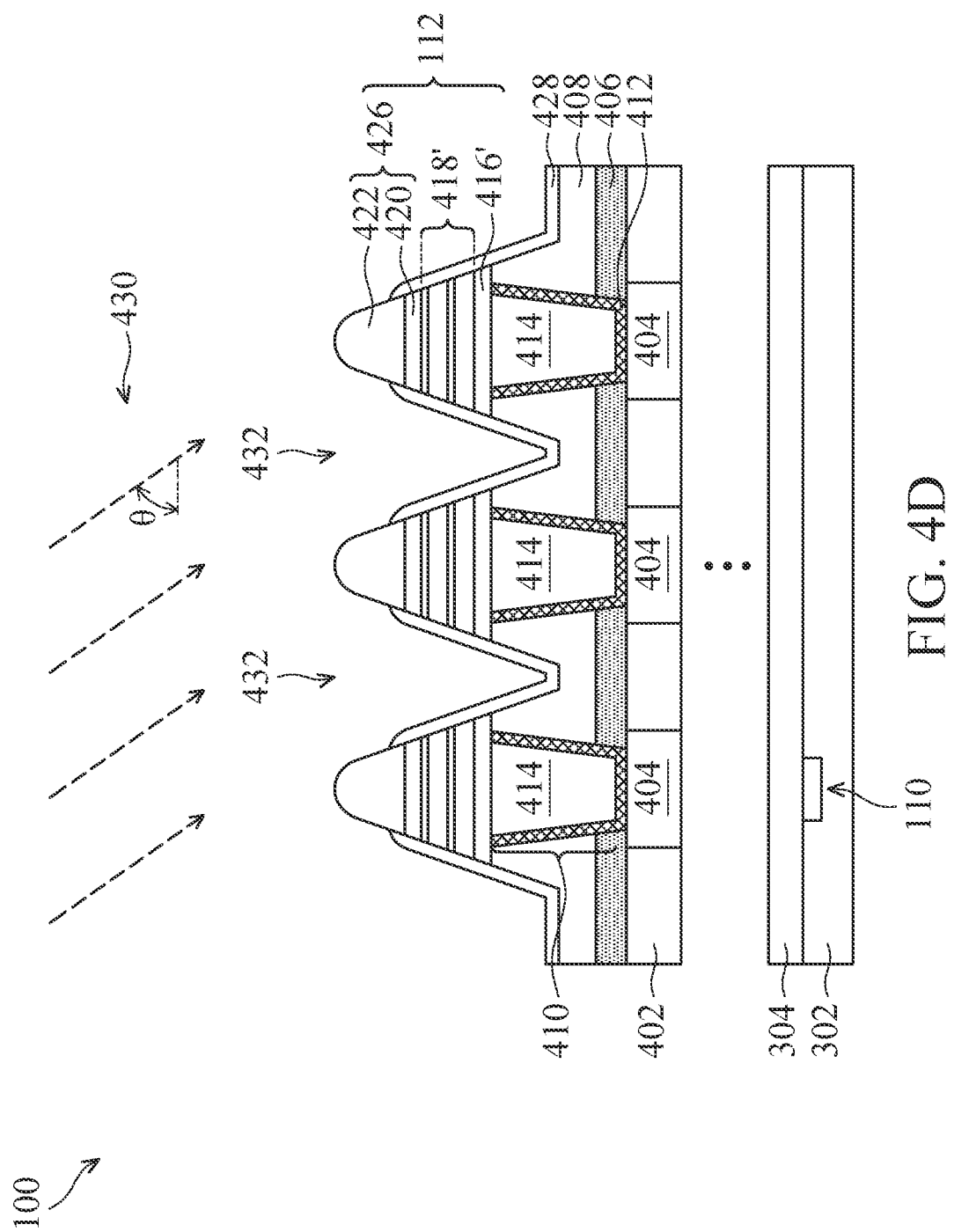

Referring to FIG. 4D, the patterned metal layer 420, the patterned metal layer 422, the patterned hard mask layer 424 are together used as an etching mask to etch and pattern the MTJ layer stack 418, and the metal layer 416 by performing an etching process 430. The patterning may include one or more etching processes, and forms recesses 432 in the IMD layer 408. The etching method used in the etching process 430 may include a plasma etching method, such as ion beam etching (IBE) process. The etching process 430 may be implemented using glow discharge plasma (GDP), capacitive coupled plasma (CCP), inductively coupled plasma (ICP), or the like.

When the etching process 430 is an IBE process, the memory device 100 may be placed on a chuck in a process chamber with etch gas (etchants). The etch gas may include inert gas, such as Ar, He, Ne, Kr, Xe, Rn. In some embodiments, the etch gas includes Cl, F, Br, I, $Si_xCl_y$, $Si_xF_y$, $Si_xBr_y$, $Si_xI_y$, MeOH (i.e., methanol ($CH_3OH$)), $CO_x$, $CF_x$, $CBr_x$, $O_2$, $N_2$, $H_2$, a combination thereof, or the like. The IBE process may be performed at a temperature in a range from about 25° C. to about 60° C. During the IBE process, a RF power applied to the process chamber for generating plasma is less than 800 W. The etch voltage applied to the chuck to induce ion bombardment is in a range from about 100V to about 400V. It should be noted that ions in the plasma of the etch gas bombard the memory device 100 at an etch angle θ in a range from about 20 degrees to about 60 degrees, in which the etch angle θ is an angle of an ion bombardment path relative to a horizontal plane.

Still referring to FIG. 4D, the hard mask layer 424 may be removed during the etching process 430. The etching process 430 forms the MTJ cells 112 including bottom electrodes 416', MTJ structures 418', and top electrodes 426 (including the metal layers 420 and 422). More specifically, the etching process 430 patterns the metal layer 416 to form the bottom electrodes 416', patterns the MTJ layer stack 418 to form the MTJ structures 418', and patterns the metal layers 420 and 422 to form the top electrodes 426. In some embodiments, the MTJ structures 418' may be also referred to as MTJ stacks. In some embodiments, the etching process 430 partially etches the IMD layer 408 and vias 410. In such embodiments, the remaining portions of the IMD layer 108 have sloped sidewalls, and have trapezoidal shapes in the illustrated cross-sectional view of FIG. 4D. The MTJ structures 418' and bottom electrodes 416' may also have sloped sidewalls, and have trapezoidal shapes in the illustrated cross-section. Further, the top electrodes 426 have domed top surfaces.

As discussed above, the etching process 430 may include the use of a plasma etching process, such as an IBE process. The IBE process offers a high level of precision (e.g., high anisotropism), which may help control the profile of the MTJ structures 418'. However, redeposition may occur during the IBE process, and in particular, metal elements etched by the IBE process may be re-sputtered on sidewalls of the MTJ structures 418'. As shown in FIG. 4D, a redeposited layer 428 are formed on the sidewalls of the MTJ structures 418' and formed on sidewalls and surfaces of the IMD layer 108. The redeposited layer 428 contains metal materials (such that the redeposited layer 428 is also referred to as metal containing layer), such as Ru, Ta, Ti, Mo, Co, Fe, Pt, Mg, Ni, Cr, a combination thereof, or the like. The redeposited layer 428 is undesired because it may short the various layers of the bottom electrodes 416', the MTJ structures 418', and the top electrodes 426, as shown in FIG. 4D.

Figure 4E:
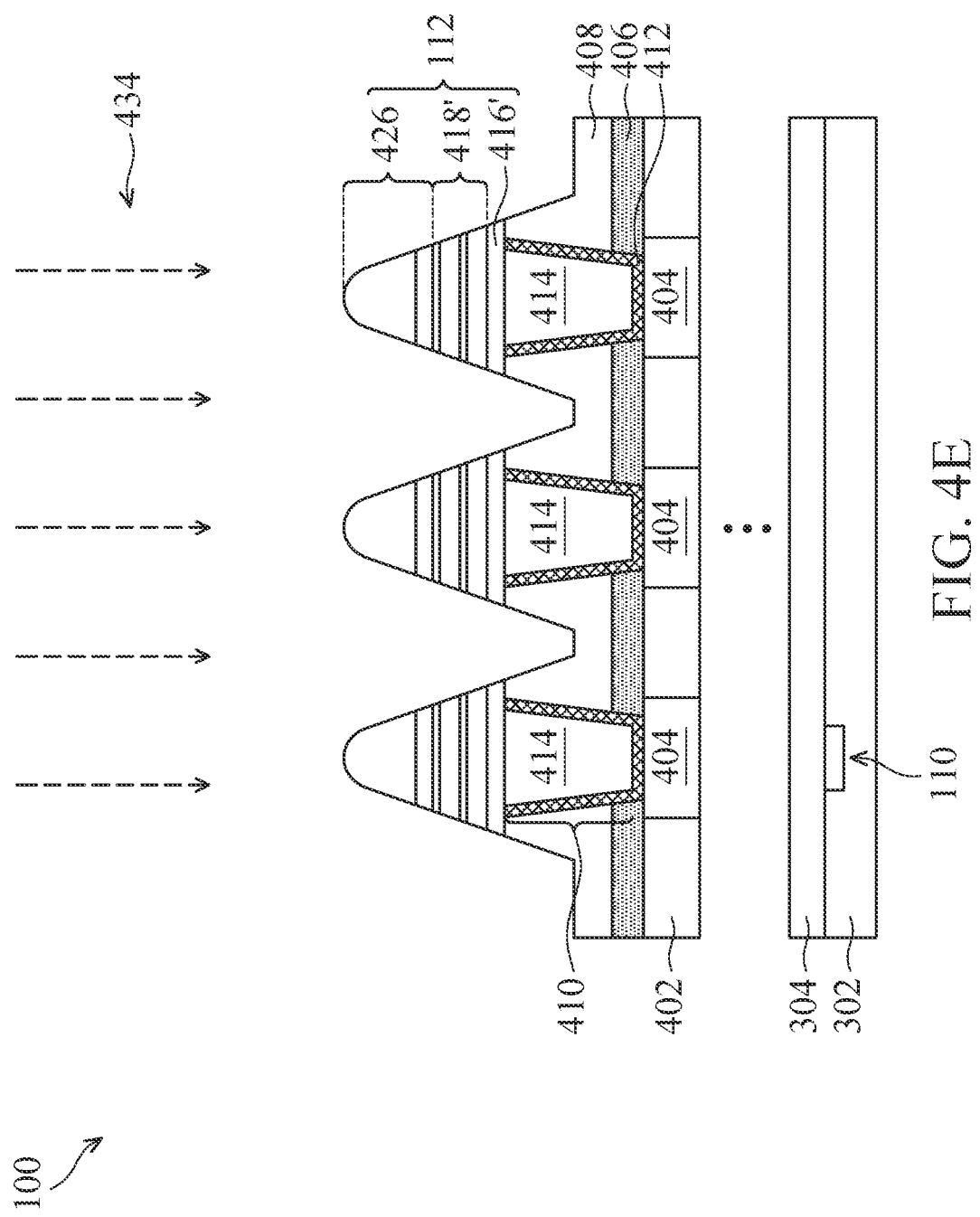

Therefore, an etching process 434 is performed to remove the redeposited layer 428, as shown in FIG. 4E. The etching method used in the etching process 434 may be a plasma etching method, such as a reactive ion etching (RIE) process. The etching process 430 may be implemented using glow discharge plasma (GDP), capacitive coupled plasma (CCP), inductively coupled plasma (ICP), or the like.

When the etching process 434 is an RIE process, the memory device 100 may be placed on a chuck in a process chamber with etch gas (etchants). The etch gas may include alcohols, such as $CH_3OH$ (MeOH, i.e., methanol), $C_2H_5OH$, $C_3H_8O$, $C_4H_{10}O$, or $C_3H_6O$. In some embodiments, the etch gas may include alkanes, such as $CH_4$, $C_2H_6$, $C_3H_8$, or $C_4H_{10}$. In other embodiments, the etch gas includes Cl, F, Br, I, $SiCl_4$, $SiCl_2$, SiHCl, $SiH_2Cl_2$, $SiHCl_3$, $SiH_4$, a combination thereof, or the like. The RIE process may be performed at a temperature in a range from about 10° C. to about 200° C. In some embodiments, the RIE process may be performed at a pressure in a range from about 3 mT to 10 mT. During the RIE process, a source power applied to the process chamber for generating plasma is in a range from about 500 W to about 3000 W. A bias voltage applied to the chuck for inducing an ion bombardment is in a range from about 100V to about 750V. In some embodiments, a plasma type used in the RIE process may be direct plasma or remote plasma.

In the etching process 434, the etch gas may be dissociated into many products, for removing the redeposited layer 428. For example, in the embodiments that alcohols (such as $CH_3OH$ (methanol) is used as the etch gas, CO, H, $CH_x$, OH, O, $CH_xO_y$, etc. are produced by dissociation. The metal elements of the redeposited layer 428 react with CO into metal carbonyls ($M(CO)_x$, in which M is metal element), such as $Fe(CO)_6$, $Cr(CO)_6$, etc. The metal carbonyls are easily vaporized so that the redeposited layer 428 is removed. Further, the metal elements of the redeposited layer 428 may also react with O dissociated from the etch gas, such that the metal elements is oxidized into insulating metal oxide material, thereby the short of the various layers of the bottom electrodes 416', the MTJ structures 418', and the top electrodes 426 is prevented.

As discussed above, the etching process 434 may include the use of a plasma etching process, such as an RIE process. The RIE process may remove the redeposited layer 428 with minimal (or no) etching of the sidewalls of the MTJ structures 418'. However, although the redeposited layer 428 is removed during etching process 434, some products dissociated from the plasma of the etch gas may damage the sidewalls of the MTJ structures 418'. More specifically, H, $CH_x$, OH, O, $CH_xO_y$ from the alcohol dissociation may react with sidewalls of the layers of the MTJ structures 418' into some undesired products on the sidewalls of the MTJ structures 418'. For example, in the embodiments that the reference layer 418A and the free layer 418C include CoFeB, CoFeB may react with O into $CoO_x$, $FeO_x$, and $B_xO_y$. In the embodiments that the tunnel barrier layer 418B include MgO, MgO may react with H, OH, $CH_x$, or $CH_xO_y$ into $MgH_2$ and $Mg(OH)_x$. Further, $CH_x$ and $CH_xO_y$ fragments may recombine into $CH_x$ and $CH_xO_y$ polymers on the sidewalls of the MTJ structures 418. These reactions may damage the MTJ structures 418', so that the resulting MTJ cell may have high resistance and degradation performance.

Figure 4F:
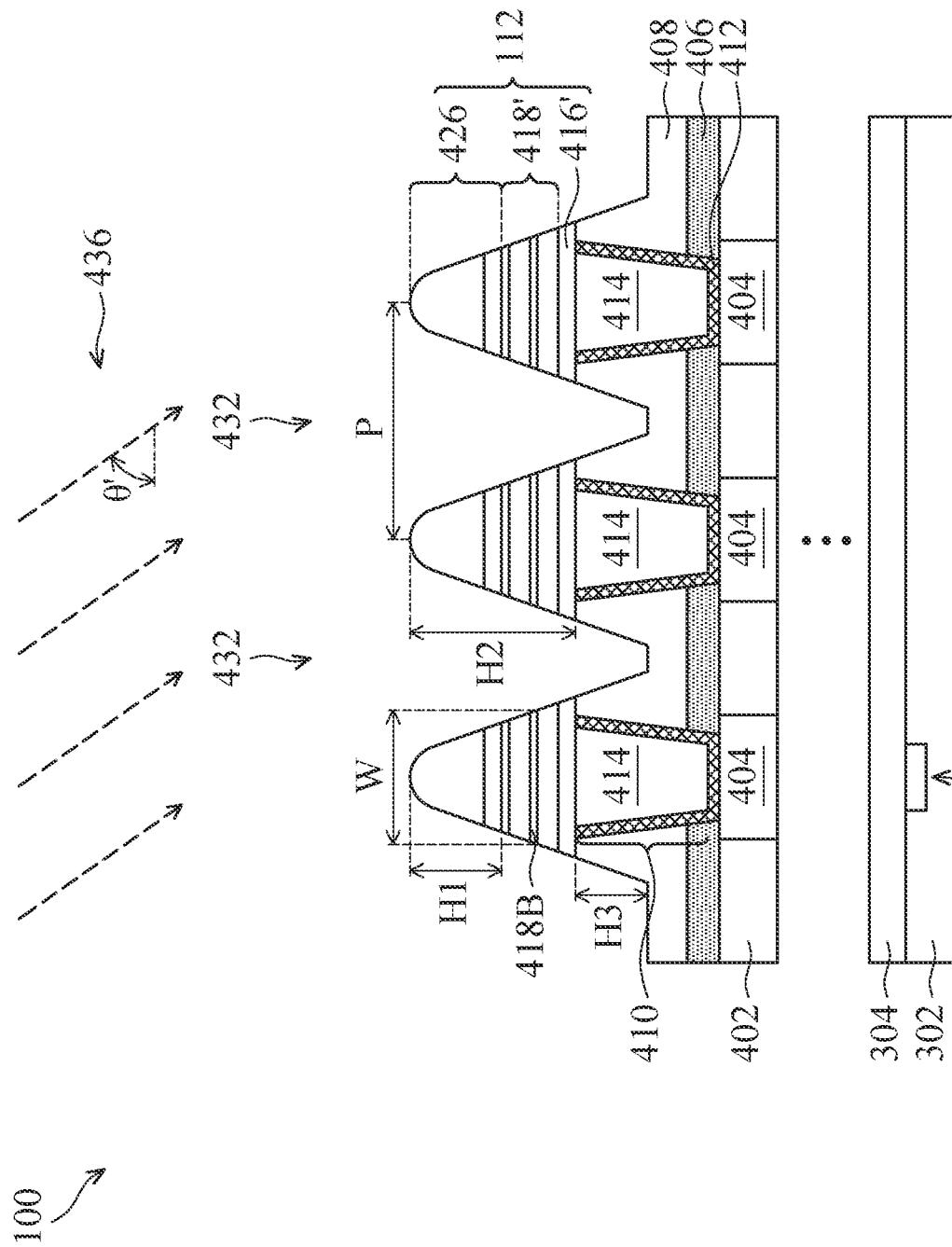

The undesired products produced during the etching process 434 should be removed. Referring to FIG. 4F, an etching process 436 is performed to trim the sidewalls of the MTJ structures 418'. The etching method used in the etching process 436 may be a plasma etching method, such as an ion beam etching (IBE) process. The etching process 436 may be implemented using glow discharge plasma (GDP), capacitive coupled plasma (CCP), inductively coupled plasma (ICP), or the like.

When the etching process 436 is an IBE process, the memory device 100 may be placed on a chuck in a process chamber with etch gas (etchants). The etch gas may include inert gas, such as Ar, He, Ne, Kr, Xe, Rn. In some embodiments, the etch gas includes Cl, F, Br, I, $Si_xCl_y$, $Si_xF_y$, $Si_xBr_y$, $Si_xI_y$, MeOH (i.e., methanol ($CH_3OH$)), $CO_x$, $CF_x$, $CBr_x$, $O_2$, $N_2$, $H_2$, a combination thereof, or the like. The IBE process may be performed at a temperature in a range from about 25° C. to about 60° C. During the IBE process, a RF power applied to the process chamber for generating plasma is less than 800 W. The etch voltage applied to the chuck to induce ion bombardment is in a range from about 50V to about 400V. It should be noted that ions in the plasma of the etch gas bombard the memory device 100 with an etch angle θ' in a range from about 20 degree to about 60 degree, in which the etch angle θ' is the angle of the ion bombardment path relative to the horizontal plane.

The etching process 436 trims the sidewalls of the MTJ structures 418' to remove the undesired products ($CoO_x$, $FeO_x$, $B_xO_y$, $MgH_2$, $Mg(OH)_x$, and $CH_x$ and $CH_xO_y$ polymers discussed above) formed on the sidewalls of the MTJ structures 418' during the etching process 434. In some embodiments, the etching process 436 may be also referred to as trimming process. The etching process 436 and 430 are the same etching method (e.g., IBE process), except that the process parameters may be different. For example, in some embodiments, for minimal (or no) etching of the sidewalls of the MTJ structures 418' during the etching process 436, the etch time of the etching process 436 for trimming the sidewalls of the MTJ structures 418' is less than the etch time of the etching process 430 for etching the MTJ layer stack 418. In some embodiments, the etch voltage of the etching process 436 is lower than the etch voltage of the etching process 430. In other embodiments, the etching process 436 and 430 use the same etch gas (e.g., Ar) with different etch angles, such as the etch angle of the etching process 436 is greater than the etch angle of the etching process 430, for minimal (or no) etching of the sidewalls of the MTJ structures 418' during the etching process 436. After the etching process 436, the MTJ structures 418' have smooth sidewalls.

After the etching process 436, the formation of the MTJ structures 418' are completed. As shown in FIG. 4F, a pitch P of the MTJ structures 418' is in a range from about 70 nm to about 180 nm. A width W of the tunnel barrier layer 418B of the MTJ structures 418' is in a range from about 30 nm to about 60 nm. A height H1 of the top electrodes 426 is in a range from about 20 nm to about 45 nm. A height H2 of the MTJ cells 112 is in a range from about 50 nm to about 85 nm. A height H3 of the recesses 432 in the IMD layer 408 is in a range from about 10 nm to about 80 nm.

Figure 4G:
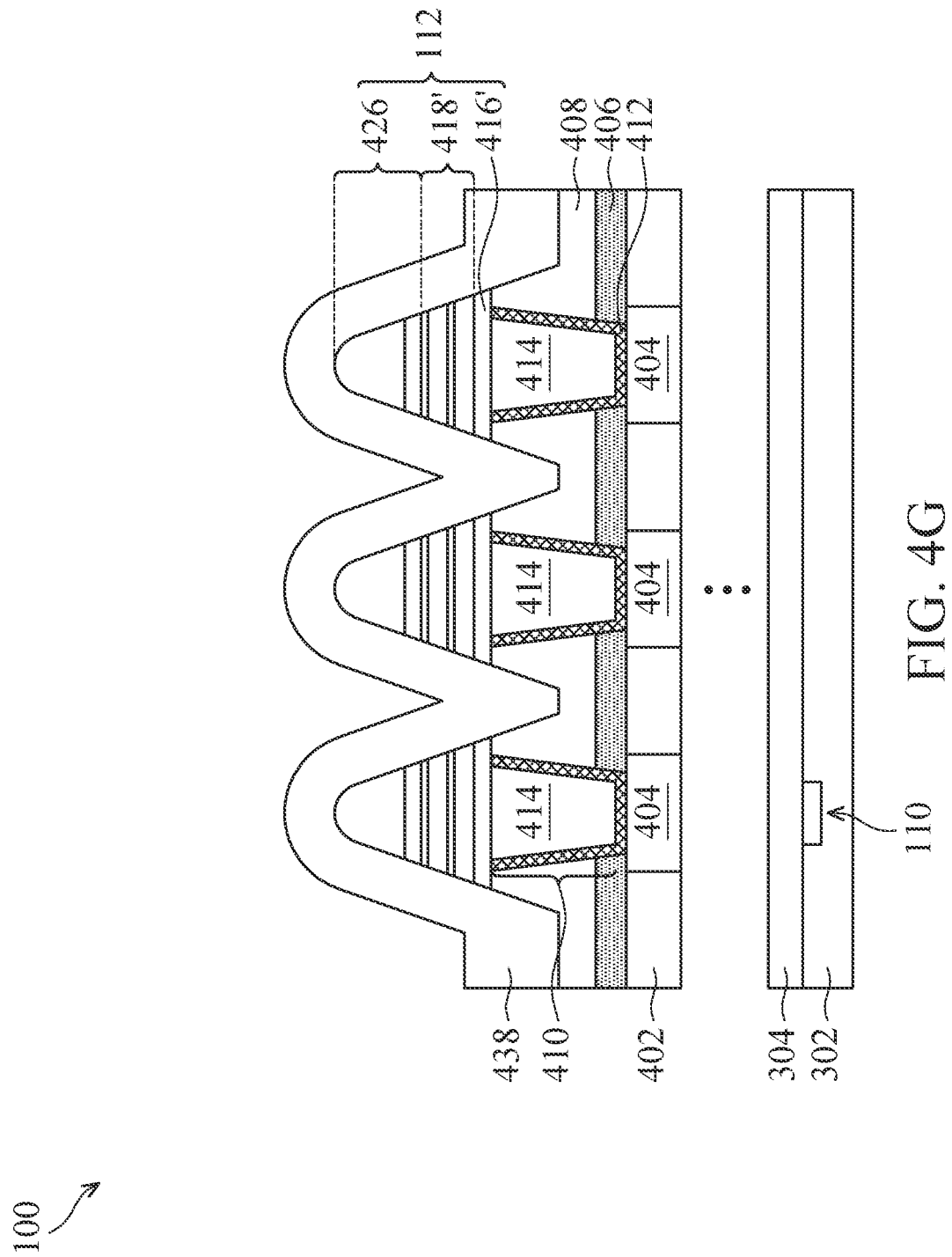

Subsequently, referring to FIG. 4G, a dielectric layer 438 is conformally formed over the bottom electrodes 416', the MTJ structures 418', and the top electrodes 426, and in the recesses 432 (as shown in FIG. 4D). In some embodiments, the dielectric layer 438 may include silicon oxide, silicon nitride, silicon oxynitride, silicon carbide, silicon carbonitride, a combination thereof, or the like, and may be formed using CVD, plasma-enhanced chemical vapor deposition (PECVD), ALD, plasma-enhanced atomic layer deposition (PEALD), PVD, a combination thereof, or the like. In some embodiments, the dielectric layer 438 may reduce or prevent moisture (e.g., $H_2O$) diffusion into the MTJ structures 418' during subsequent processes.

Figure 4H:
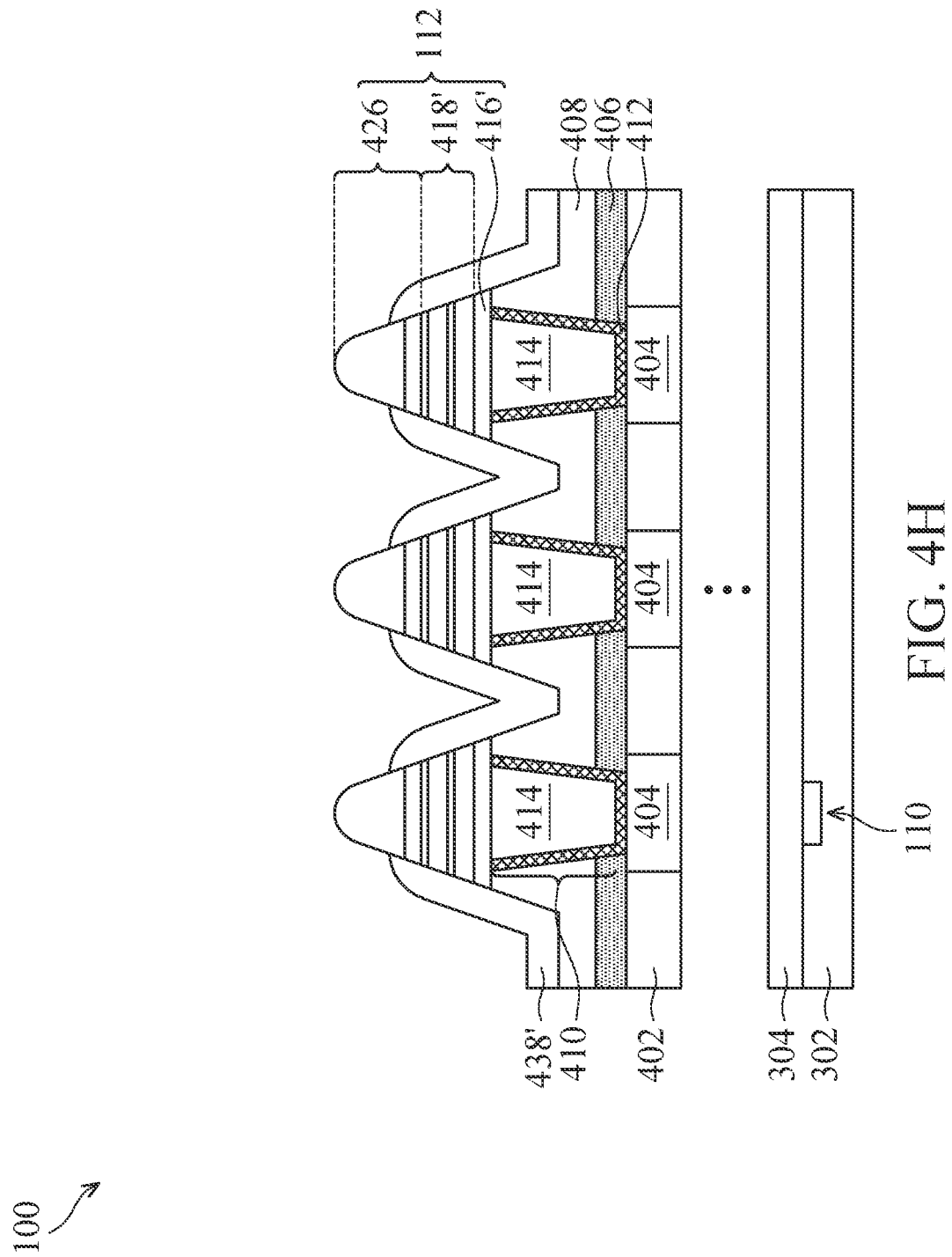

Referring to FIG. 4H, the dielectric layer 438 is patterned to form first sidewall spacers 438' on the sidewalls of the MTJ structures 418'. In some embodiments, the patterning is a dry etching process, such as an anisotropic etching process. As shown in FIG. 4H, the top portions of the top electrodes 426 are partially exposed. In other embodiments, the top of the first sidewall spacers 438' is higher than the top of the MTJ structures 418'.

Figure 4I:
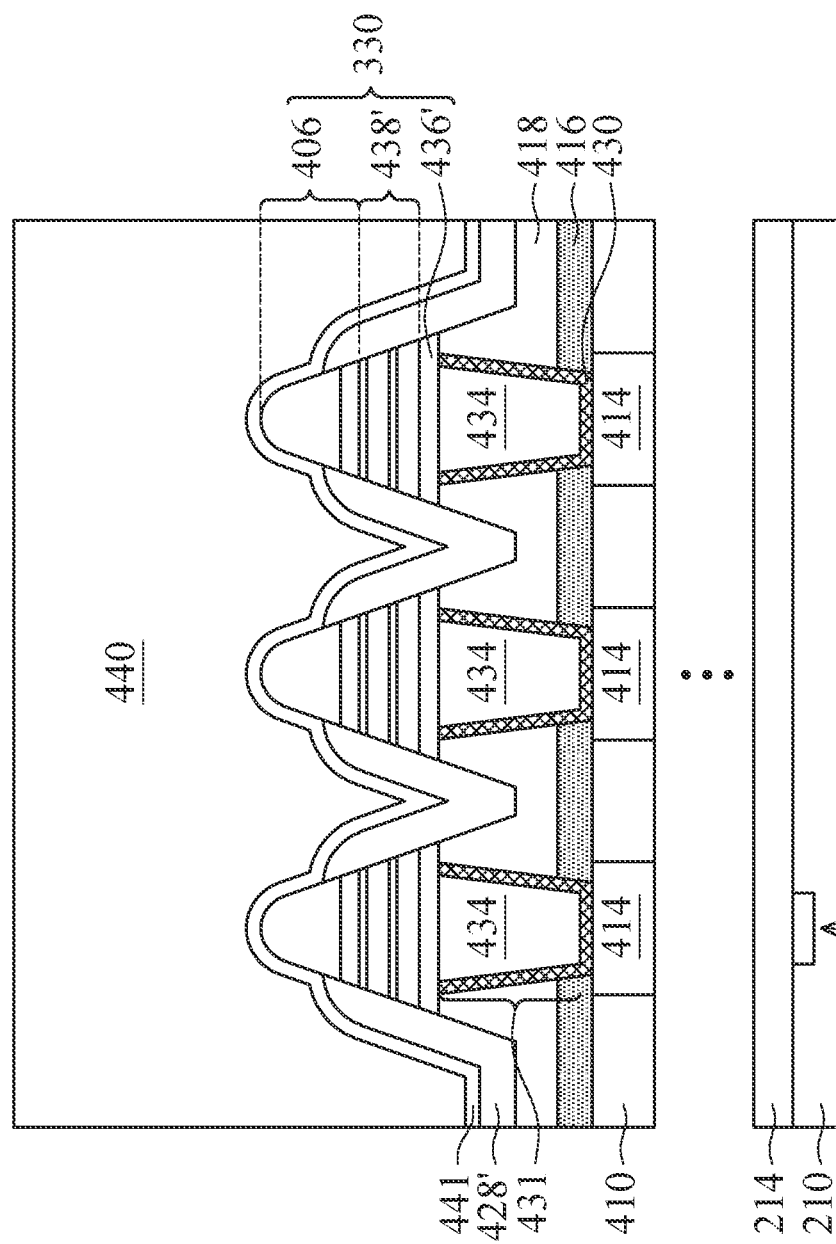

Referring to FIG. 4I, a dielectric layer 440 is formed over the first sidewall spacers 438' and the top electrodes 426, and an oxide layer 442 is formed over the dielectric layer 440. In some embodiments, the dielectric layer 440 is formed of one of the candidate materials and methods for the dielectric layer 438, but is formed of a different material than the dielectric layer 438. For example, the dielectric layer 438 may be formed of an oxide, e.g., silicon oxide, and dielectric layer 440 can be formed of a nitride, e.g., silicon nitride. In some embodiments, the oxide layer 442 may include silicon oxide, or the like, and may be formed using CVD, PECVD, ALD, PEALD, a combination thereof, or the like.

Figure 4J:
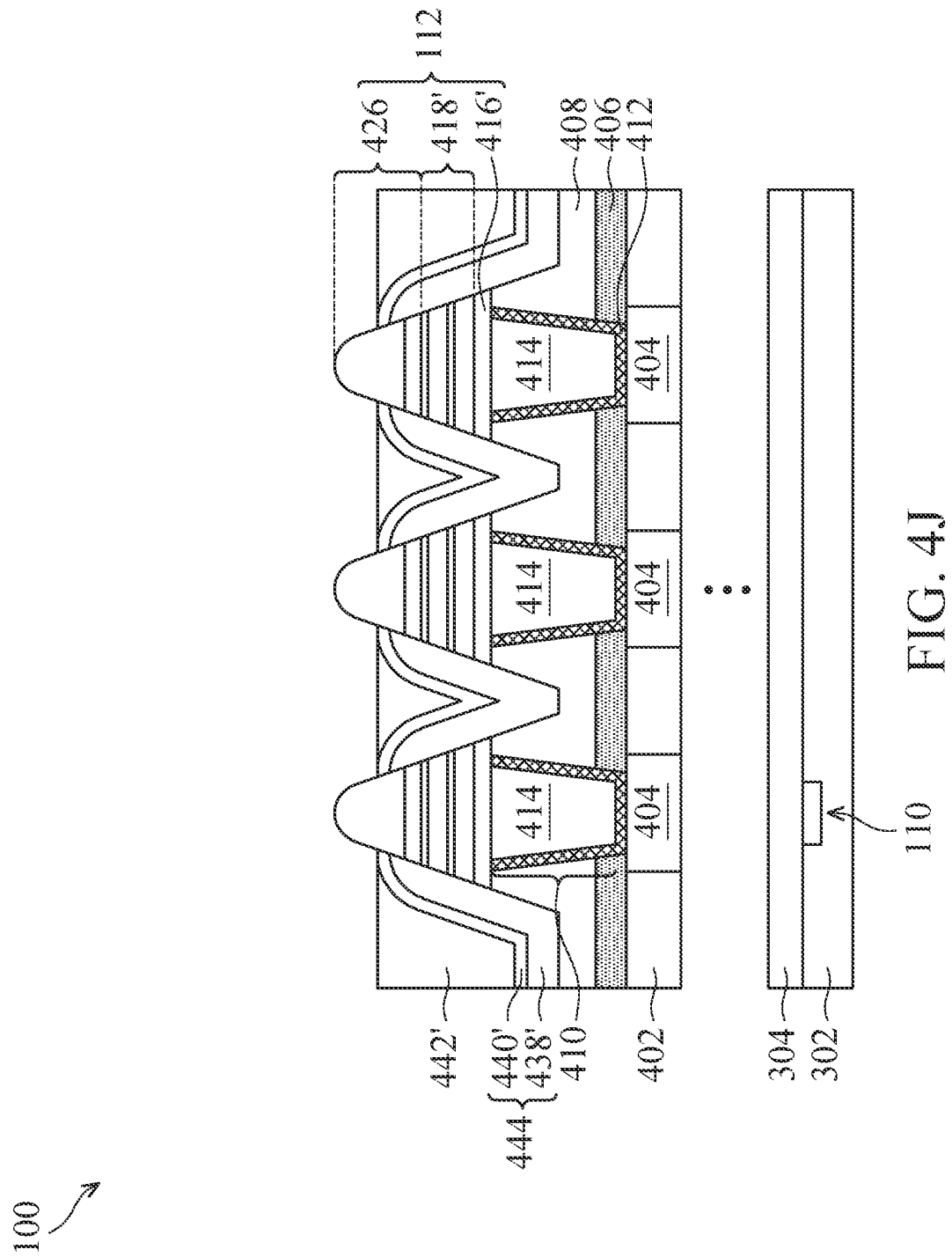

Referring to FIG. 4J, the dielectric layer 440 and oxide layer 442 are etched by performing one or more dry etching processes to form second sidewall spacers 440' and a IMD layer 442'. In some embodiments, the one or more dry etching processes are anisotropic etching processes. As shown in FIG. 4J, the top portions of the top electrodes 426 are partially exposed. In some embodiments, the top surfaces of the second sidewall spacers 440' and the IMD layer 442' are higher than the top surfaces of the MTJ structures 418'. In some embodiments, the first sidewall spacers 438' and the second sidewall spacers 440' may be collectively referred to as sidewall spacers 444 on the sidewalls of the MTJ structures 418'.

Figure 4K:
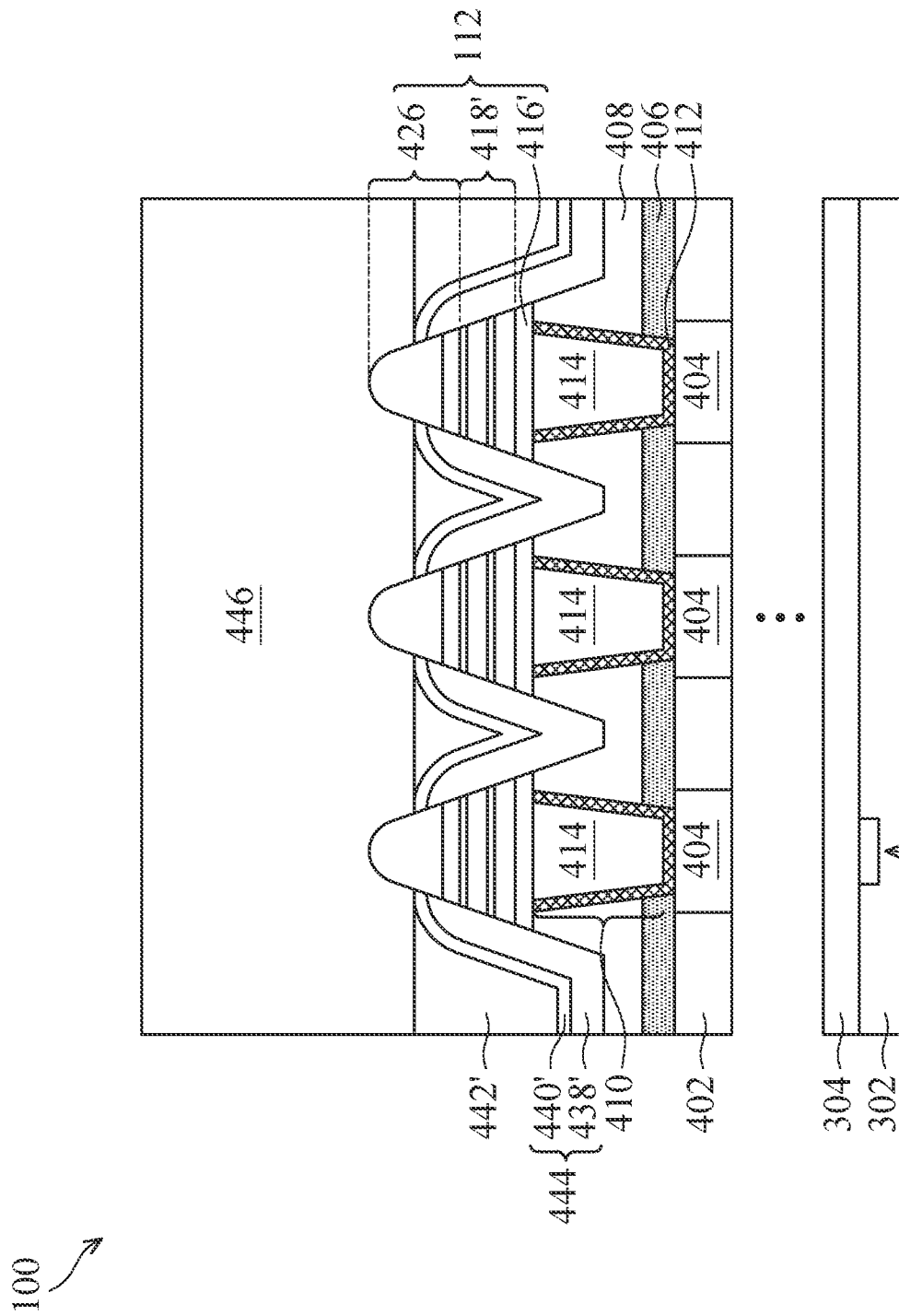

Referring to FIG. 4K, an IMD layer 446 is formed over the MTJ cells 112 (including bottom electrodes 416', MTJ structures 418', and top electrodes 426), the sidewall spacers 444 (including the first sidewall spacers 438' and the second sidewall spacers 440'), and the IMD layer 442'. Similar to the IMD layer 408 discussed above, in some embodiments, the IMD layer 446 is formed of a tetraethyl orthosilicate (TEOS) oxide (e.g., silicon oxide deposited using, e.g., a chemical vapor deposition (CVD) process with TEOS as a precursor). In some embodiments, the IMD layer 408 may be formed using PSG, BSG, BPSG, undoped silicate glass (USG), fluorosilicate glass (FSG), SiOCH, flowable oxide, a porous oxide, or the like, or a combination thereof. The IMD layer 446 may also be formed of a low-k dielectric material with a k-value lower than about 3.0.

Figure 4L:
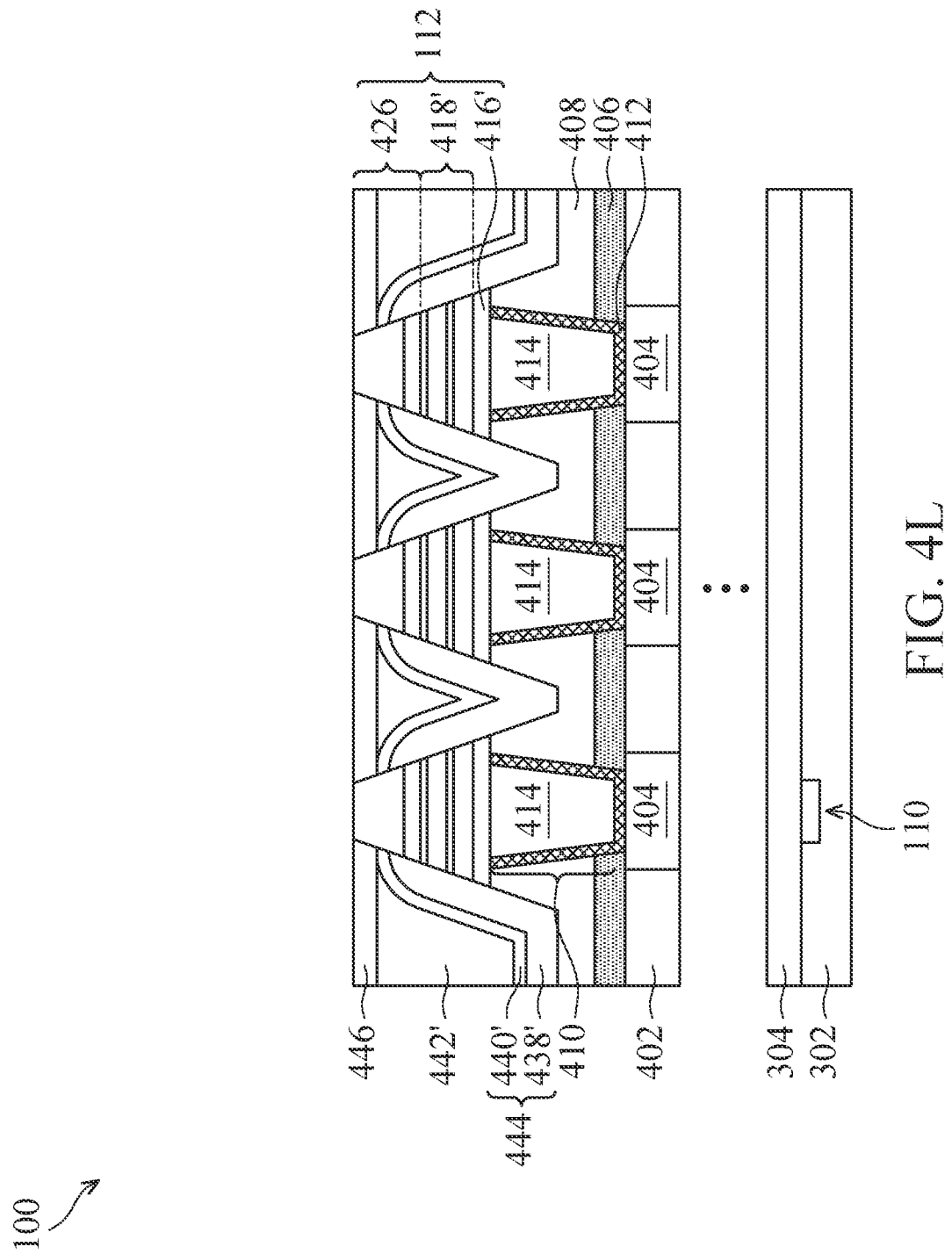

Referring to FIG. 4L, a planarization process, such a CMP process, is performed to remove a portion of the IMD layer 446 over the MTJ cells 112. The planarization process further exposes the top surfaces of the top electrodes 426. In some embodiments, the top surfaces of the top electrodes 426 (specifically, the metal layer 422) are planar with the top surface of the IMD layer 446 after the planarization process. In some embodiments, the MTJ cells 112 (including bottom electrodes 416', MTJ structures 418', and top electrodes 426) has a trapezoidal shape after the planarization process.

Figure 4M:
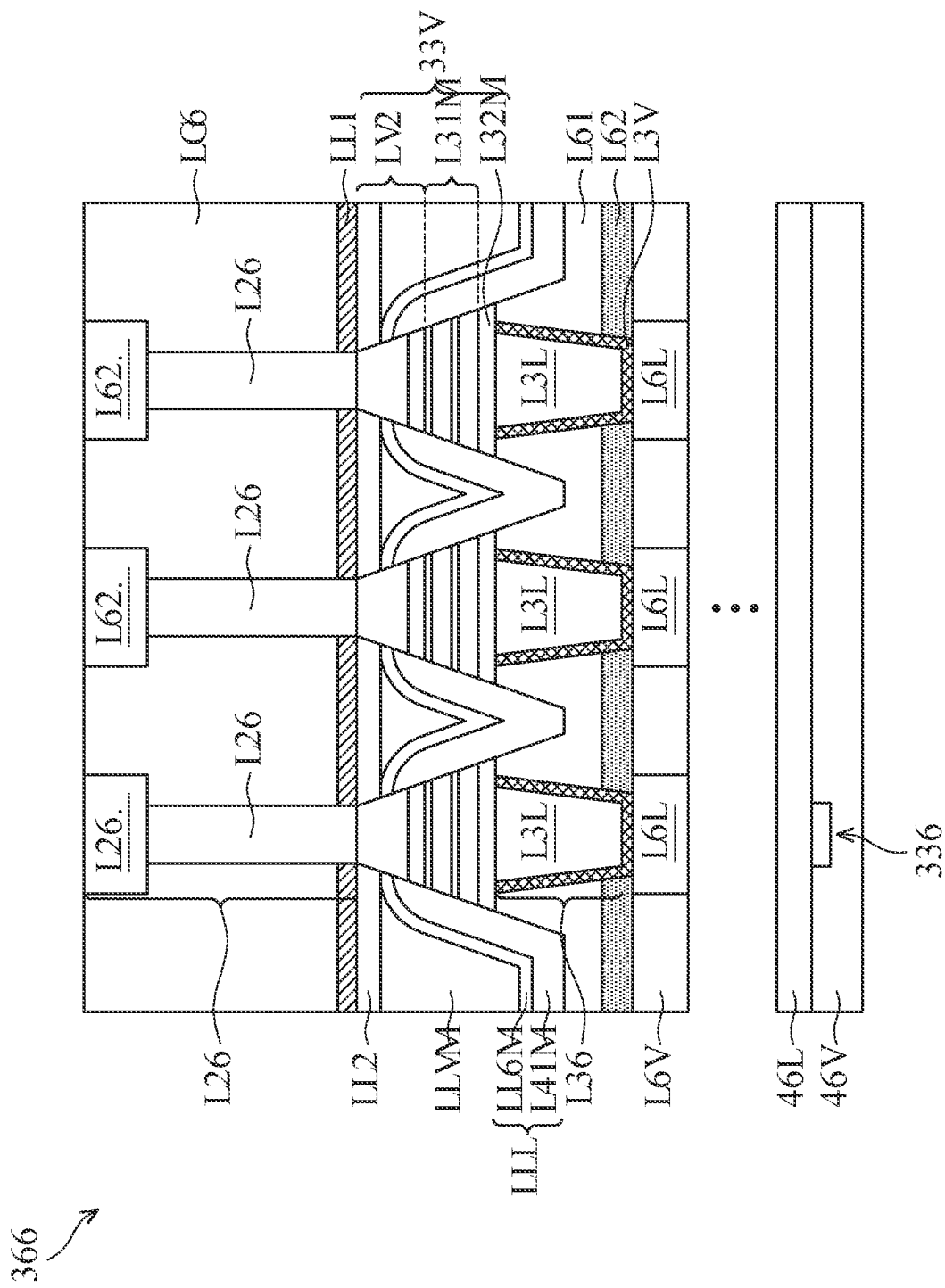

Referring to FIG. 4M, a metallization layer (e.g., the metallization layer M6 shown in FIG. 2) of the interconnect structure is formed over the MTJ cells 112 and the IMD layer 442. The metallization layer includes an etch stop layer 448, an IMD layer 450, and conductive features 460. The conductive features 460 each include a via 460V (which may correspond to the vias V6, as shown in FIG. 2) and a conductive feature 460L (which may correspond to the metal lines L6, as shown in FIG. 2).

The etch stop layer 448 is formed using similar materials, such as aluminum nitride, aluminum oxide, silicon oxide, silicon nitride, silicon oxynitride, silicon carbide, a combination thereof, or the like. The etch stop layer 448 may be formed by chemical vapor deposition (CVD), PVD, ALD, a spin-on-dielectric process, the like, or a combination thereof. The etch stop layer 448 may also be a composite layer formed of a plurality of different dielectric sublayers.

The IMD layer 450 is formed using similar materials as the IMD layers 408 and 446, such as a tetraethyl orthosilicate (TEOS) oxide (e.g., silicon oxide deposited using, e.g., a chemical vapor deposition (CVD) process with TEOS as a precursor). In some embodiments, the IMD layer 450 may be formed using PSG, BSG, BPSG, undoped silicate glass (USG), fluorosilicate glass (FSG), SiOCH, flowable oxide, a porous oxide, or the like, or a combination thereof. The IMD layer 450 may also be formed of a low-k dielectric material with a k-value lower than about 3.0.

The vias 460V and the conductive features 460L of the conductive features 460 may be respectively similar the vias 410 and the conductive features 404. The vias 460V may each include a conductive material and a conductive barrier layer lining sidewalls and bottom surfaces of the conductive material, in which the conductive barrier layer may be formed of titanium, titanium nitride, tantalum, tantalum nitride, cobalt, a combination thereof, or the like, and the conductive material 414 may be formed of copper, aluminum, tungsten, cobalt, alloys thereof, or the like.

The conductive features 460L include diffusion barrier layers and conductive material over the diffusion barrier layers. The diffusion barrier layers may be formed of TaN, Ta, TiN, Ti, CoW, or the like, and may be formed by a deposition process such as atomic layer deposition (ALD) or the like. The conductive material may include copper, aluminum, tungsten, silver, and a combination thereof, or the like, and may be formed over the diffusion barrier layers by an electro-chemical plating process, CVD, ALD, PVD, the like, or a combination thereof. In some embodiments, the conductive features 460L may be also referred to as metal lines.

As shown in FIG. 4M, the conductive features 460 are electrically connected to the MTJ cells 112. More specifically, the conductive features 460 are physically and electrically connected to the top electrodes 426. Although each via 460V and corresponding conductive line 460L is illustrated as a separate element, it should be appreciated that they may be a continuous conductive feature, such as in embodiments where they are formed by a dual damascene process.

Figure 5A:
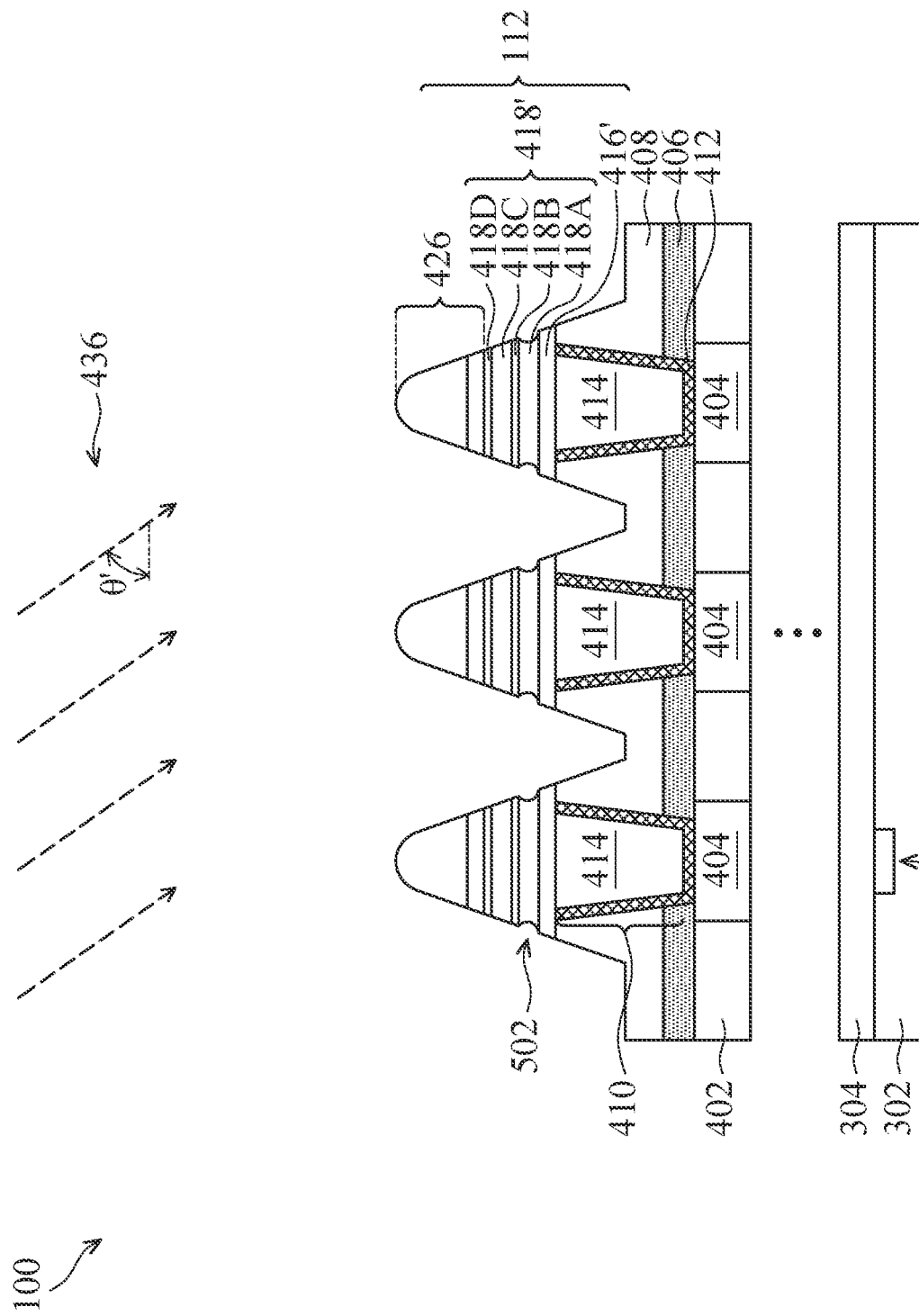
FIGS. 5A and 5B are cross-sectional views of intermediate stages in the manufacturing of the MRAM devices in the memory device, in which are respectively at the same intermediate stages as FIGS. 4F and 4M, respectively, in accordance with some embodiments.

FIG. 5A illustrates a cross-sectional view at the same intermediate stage as FIG. 4F. As discussed above, the etching process 436 is performed to trim the sidewalls of the MTJ structures 418' to remove the undesired products ($CoO_x$, $FeO_x$, $B_xO_y$, $MgH_2$, $Mg(OH)_x$, and $CH_x$ and $CH_xO_y$ polymers discussed above) formed on the sidewalls of the MTJ structures 418' during the etching process 434. In the embodiments that the reference layer 418A in the MTJ structures 418' is thicker than the tunnel barrier layer 418B and the free layer 418C, the reference layer 418A has a larger surface area of the exposed sidewalls. Therefore, the etch rate of the etching process 436 on the sidewalls of the reference layer 418A may be high to form recesses. As shown in FIG. 5A, recesses 502 are formed in the sidewalls of the reference layer 418A, resulting in the reference layer 418A has recessed sidewalls after the etching process 436. In some aspects, the reference layer 418A has concave sidewalls after the etching process 436.

Figure 5B:
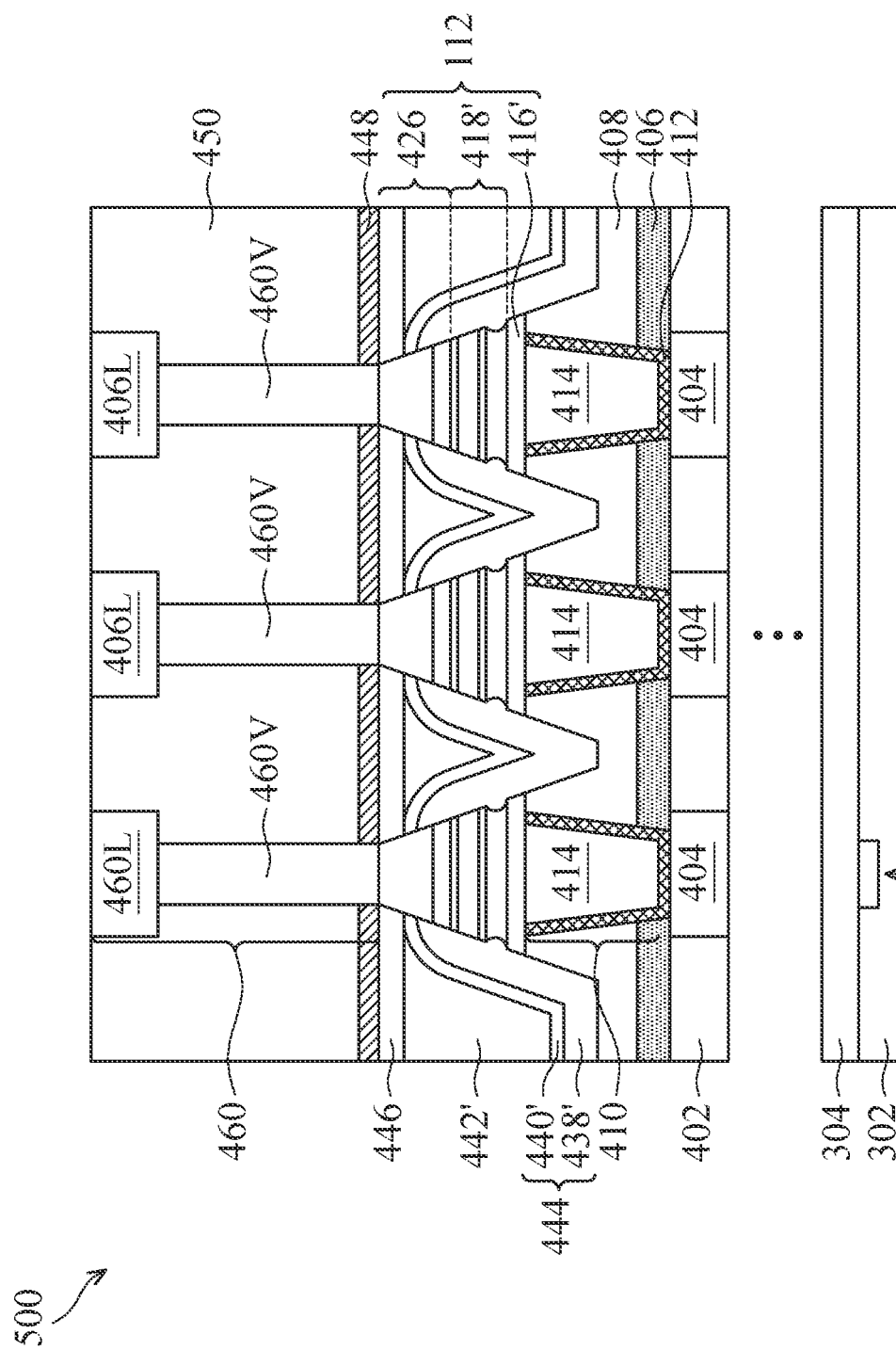

FIG. 5B illustrates a cross-sectional view of the resulting memory device after the processes similar to those in FIGS. 4G to 4M are performed on the memory device 100 of FIG. 5A. As show in FIG. 5B, spacers 444 fill the recesses 502. More specifically, the material of the first sidewall spacers 438' fills the recesses 502. In some embodiments, the spacers 444 (the first sidewall spacers 438') are in contact with the concave sidewalls of the reference layer 418A formed by the etching process 436. In some aspects, the spacers 444 (the first sidewall spacers 438') has extended portions extend between the tunnel barrier layer 418B and bottom electrodes 416'.

Figure 6A:
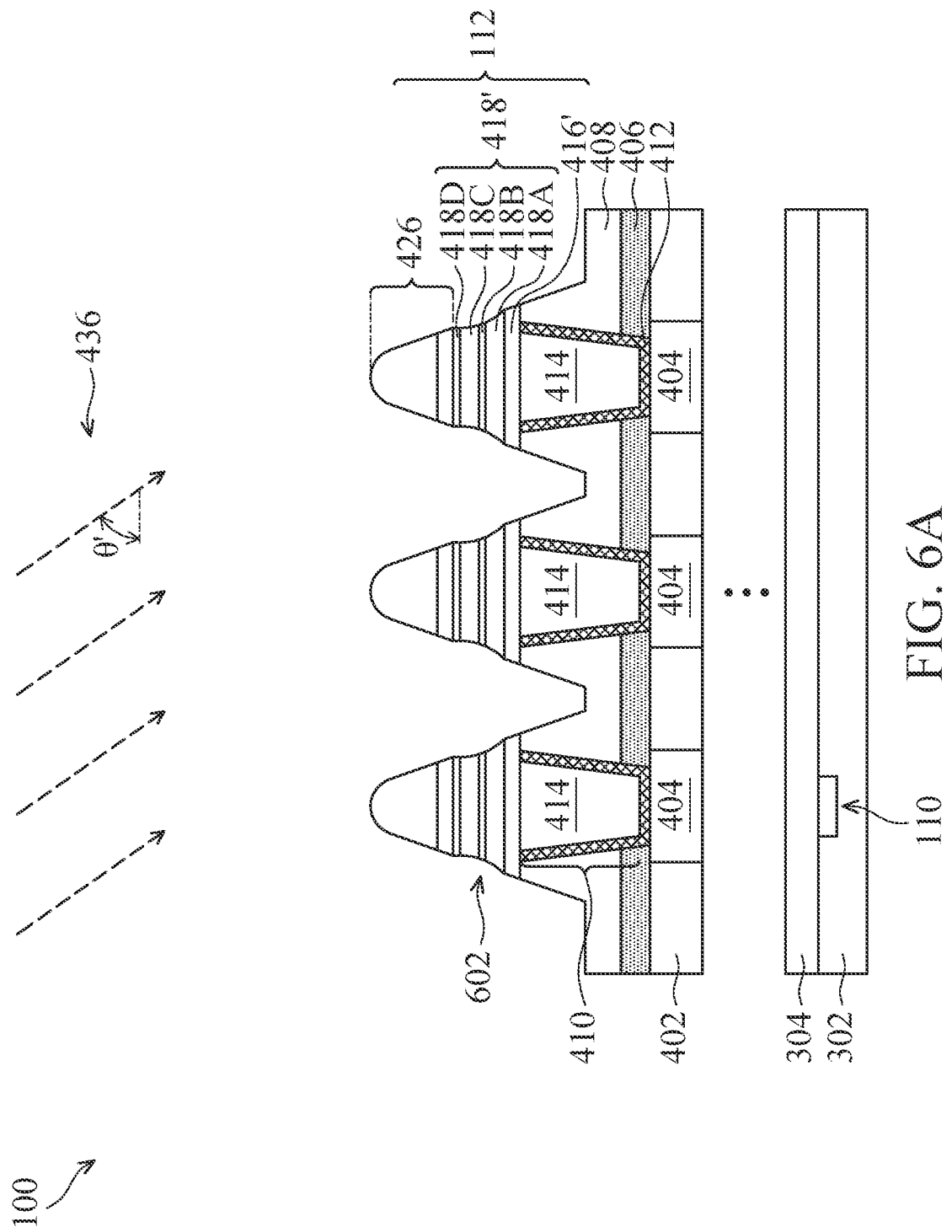
FIGS. 6A and 6B are cross-sectional views of intermediate stages in the manufacturing of the MRAM devices in the memory device, in which are respectively at the same intermediate stages as FIGS. 4F and 4M, respectively, in accordance with some embodiments.

FIG. 6A illustrates a cross-sectional view at the same intermediate stage as FIG. 4F. Similarly, the undesired products ($CoO_x$, $FeO_x$, $B_xO_y$, $MgH_2$, $Mg(OH)_x$, and $CH_x$ and $CH_xO_y$ polymers discussed above) on the sidewalls of the MTJ structures 418' are removed during the etching process 436. In some embodiments, the etching process 436 may etch some portions of the MTJ structures 418' to form recesses in the sidewalls of the MTJ structures 418'. As shown in FIG. 6A, recesses 602 are formed in the sidewalls of the MTJ structures 418', resulting in the MTJ structures 418' have recessed sidewalls after the etching process 436. More specifically, the reference layer 418A, the tunnel barrier layer 418B, free layer 418C, and capping layer 418D of the MTJ structures 418' are etched during the etching process 436, so that the sidewalls of the reference layer 418A, the tunnel barrier layer 418B, free layer 418C, and capping layer 418D all have recessed sidewalls. In some aspects, the MTJ structures 418' (the reference layer 418A, the tunnel barrier layer 418B, free layer 418C, and capping layer 418D) have concave sidewalls after the etching process 436.

Figure 6B:
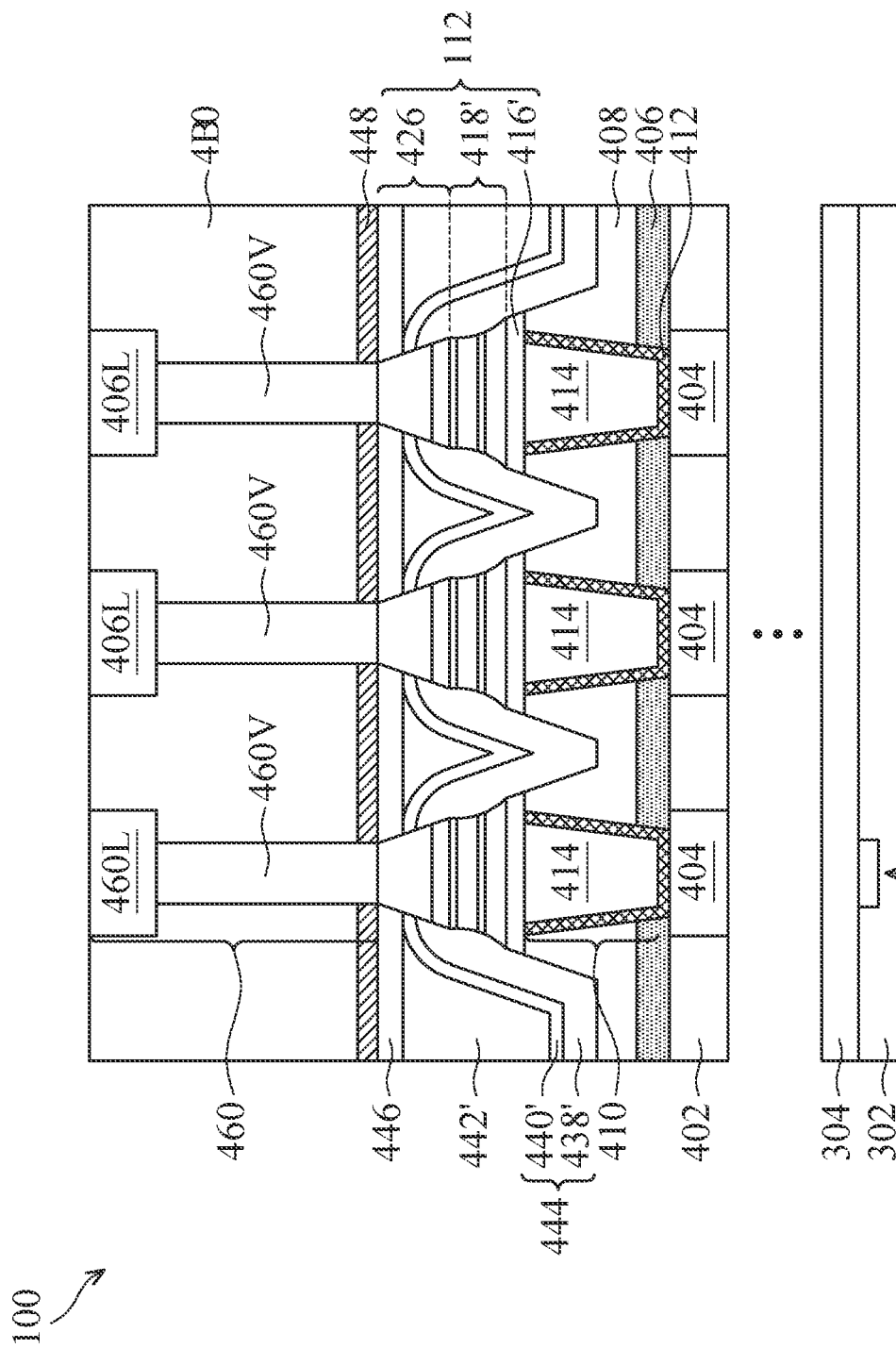

FIG. 6B illustrates a cross-sectional view of the resulting memory device after the processes similar to those in FIGS. 4G to 4M are performed on the memory device 100 of FIG. 6A. As show in FIG. 6B, spacers 444 fill the recesses 602. More specifically, the material of the first sidewall spacers 438' fills the recesses 602. In some embodiments, the spacers 444 (the first sidewall spacers 438') are in contact with the concave sidewalls of the MTJ structures 418' formed by the etching process 436. In some aspects, the spacers 444 (the first sidewall spacers 438') has extended portions extend between the top electrodes 426 (specifically, the metal layer 422) and bottom electrodes 416'.

The embodiments disclosed herein relate to memory devices and their manufacturing methods, and more particularly to methods comprising an etching process for trimming sidewalls of an MTJ structure of an MRAM device, in which the etching process remove some undesired products (e.g., $CoO_x$, $FeO_x$, $B_xO_y$, $MgH_2$, $Mg(OH)_x$, and $CH_x$ and $CH_xO_y$ polymers discussed above) on the sidewalls of the MTJ structures. Therefore, high resistance and degradation performance of the MRAM device due to the undesired products on the sidewalls of the MTJ structures may be prevented.

Thus, one of the embodiments of the present disclosure described a method for manufacturing a memory device that includes forming a first metal layer over a substrate, forming a magnetic tunnel junction (MTJ) layer stack over the first metal layer, forming a second metal layer over the MTJ layer stack, forming a hard mask layer over the second metal layer, performing a first etching process on the MTJ layer stack to form an MTJ structure and a redeposited layer on a sidewall of the MTJ structure, performing a second etching process to remove the redeposited layer, and performing a third etching process on the sidewall of the MTJ structure.

In some embodiments, the redeposited layer contains metal materials.

In some embodiments, the first etching process and the third etching process are ion beam etching processes and the second etching process is a reactive ion etching process.

In some embodiments, an etch gas of the second etching process comprises alcohols.

In some embodiments, an etch gas of the second etching process and the third etching process comprises inert gas.

In some embodiments, the etch voltage of the third etching process is lower than the etch voltage of the first etching process.

In some embodiments, an etch angle of the third etching process is greater than an etch angle of the first etching process.

In some embodiments, an etch time of the third etching process is less than an etch time of the first etching process.

In some embodiments, the MTJ structure includes a reference layer, a tunnel barrier layer over the reference layer, and a free layer over the tunnel barrier layer.

In some embodiments, the reference layer has a recessed sidewall.

In another of the embodiments, discussed is a method for manufacturing a memory device that includes forming a bottom electrode layer over a substrate, forming a magnetic tunnel junction (MTJ) layer stack over the bottom electrode layer, forming a top electrode layer over the MTJ layer stack, patterning the MTJ layer stack by performing a first etching process to form an MTJ stack and a metal containing layer on a sidewall of the MTJ stack, removing the metal containing layer by performing a second etching process, and trimming the sidewall of the MTJ stack by performing a third etching process.

In some embodiments, the metal containing layer comprises Ru, Ta, Ti, Mo, Co, Fe, Pt, Mg, Ni, Cr, or a combination thereof.

In some embodiments, the etch gas of the first etching process and third etching process comprises Ar, Cl, F, Br, I, He, Ne, Kr, Xe, or Rn.

In some embodiments, an etch gas of the second etching process comprises $CH_3OH$, $C_2H_5OH$, $C_3H_8O$, $C_7H_{10}O$, or $C_3H_6O$.

In some embodiments, the first etching process and the third etching process are the same etching method.

In some embodiments, the etch voltage of the third etching process is lower than the etch voltage of the first etching process.

In some embodiments, the first etching process and the third etching process use the same etch gas with different etch angles.

In yet another of the embodiments, discussed is a memory device including forming a substrate, a first conductive feature, a bottom electrode, a magnetic tunnel junction (MTJ) structure, a top electrode, and a second conductive feature. The substrate includes an active device. The first conductive feature is over and electrically connected to the active device. The bottom electrode is over the first conductive feature. The MTJ structure includes a reference layer over the bottom electrode, a tunnel barrier layer over the reference layer, a free layer over the tunnel barrier layer, and a cap layer over the free layer. The reference layer has a recessed sidewall. The top electrode is over the cap layer. The second conductive feature is over and electrically connected to the top electrode.

In some embodiments, the tunnel barrier layer and the free layer have recessed sidewalls.

In some embodiments, the tunnel barrier layer has a width in a range from about 30 nm to about 60 nm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a memory device, comprising:
   forming a first metal layer over a substrate;
   forming a magnetic tunnel junction (MTJ) layer stack over the first metal layer;
   forming a second metal layer over the MTJ layer stack;
   forming a hard mask layer over the second metal layer;
   performing a first etching process on the MTJ layer stack to form an MTJ structure and a redeposited layer covering a sloped sidewall of the MTJ structure;
   performing a second etching process to remove the redeposited layer; and
   performing a third etching process on the sloped sidewall of the MTJ structure, wherein an etch time of the third etching process is less than an etch time of the first etching process.

2. The method of claim 1, wherein the redeposited layer contains metal materials.

3. The method of claim 1, wherein the first etching process and the third etching process are ion beam etching processes and the second etching process is a reactive ion etching process.

4. The method of claim 3, wherein an etch gas of the second etching process comprises alcohols.

5. The method of claim 3, wherein an etch gas of the first etching process and the third etching process comprises inert gas.

6. The method of claim 3, wherein an etch voltage of the third etching process is lower than an etch voltage of the first etching process.

7. The method of claim 3, wherein an etch angle of the third etching process is greater than an etch angle of the first etching process.

8. The method of claim 1, wherein the MTJ structure comprising:
   a reference layer;
   a tunnel barrier layer over the reference layer; and
   a free layer over the tunnel barrier layer.

9. The method of claim 8, wherein the reference layer has a recessed sidewall.

10. A method for manufacturing a memory device, comprising:
    forming a bottom electrode layer over a substrate;
    forming a magnetic tunnel junction (MTJ) layer stack over the bottom electrode layer;
    forming a top electrode layer over the MTJ layer stack;
    patterning the MTJ layer stack by performing a first etching process to form an MTJ stack and a metal containing layer on a sidewall of the MTJ stack;
    removing the metal containing layer by performing a second etching process, wherein an etch gas of the second etching process comprises $CH_3OH$, $C_2H_5OH$, $C_3H_8O$, $C_7H_{10}O$, or $C_3H_6O$; and
    trimming the sidewall of the MTJ stack by performing a third etching process.

11. The method of claim 10, wherein the metal containing layer comprises Ru, Ta, Ti, Mo, Co, Fe, Pt, Mg, Ni, Cr, or a combination thereof.

12. The method of claim 10, wherein an etch gas of the first etching process and the third etching process comprises Ar, Cl, F, Br, I, He, Ne, Kr, Xe, or Rn.

13. The method of claim 10, wherein the first etching process and the third etching process are the same etching method.

14. The method of claim 13, wherein an etch voltage of the third etching process is lower than an etch voltage of the first etching process.

15. The method of claim 13, wherein the first etching process and the third etching process use the same etch gas with different etch angles.

16. A method for manufacturing a memory device, comprising:

forming a interconnect structure comprising conductive features over a substrate;

forming vias electrically connected to the conductive features;

forming a first metal layer over the vias;

forming a magnetic tunnel junction (MTJ) layer stack over the first metal layer, wherein the MTJ layer stack comprises a reference layer over the first metal layer, a tunnel barrier layer over the reference layer, a free layer over the tunnel barrier layer, a cap layer over the free layer;

forming a second metal layer over the MTJ layer stack;

performing a first ion beam etching process on the MTJ layer stack to form MTJ structures and a redeposited layer on sidewalls of the MTJ structures;

performing a reactive ion etching process to remove the redeposited layer; and performing a second ion beam etching process to trim the sidewalls of the MTJ structures.

17. The method of claim 16, wherein the tunnel barrier layer and the free layer have recessed sidewalls.

18. The method of claim 16, wherein the tunnel barrier layer has a width in a range from about 30 nm to about 60 nm.

19. The method of claim 10, wherein the top electrode layer has a domed top surface.

20. The method of claim 1, further comprising:

forming sidewall spacers on sidewalls of the MTJ structure, wherein bottom surfaces of the sidewall spacers are lower than a bottom surface of the first metal layer.

* * * * *